(12) United States Patent
Atanackovic

(10) Patent No.: US 7,135,699 B1
(45) Date of Patent: Nov. 14, 2006

(54) METHOD AND APPARATUS FOR GROWTH OF SINGLE-CRYSTAL RARE-EARTH OXIDES, NITRIDES, AND PHOSPHIDES

(75) Inventor: Petar B. Atanackovic, Palo Alto, CA (US)

(73) Assignee: Translucent Photonics, Inc., Palo Alto, CA (US)

( * ) Notice: Subject to any disclaimer, the term of this patent is extended or adjusted under 35 U.S.C. 154(b) by 101 days.

(21) Appl. No.: 10/746,957

(22) Filed: Dec. 23, 2003

Related U.S. Application Data

(63) Continuation-in-part of application No. 09/924,392, filed on Aug. 7, 2001, now Pat. No. 6,734,453.

(60) Provisional application No. 60/223,874, filed on Aug. 8, 2000.

(51) Int. Cl.
*H01L 29/15* (2006.01)
(52) U.S. Cl. ............................ 257/22; 257/13
(58) Field of Classification Search .............. 257/13, 257/22
See application file for complete search history.

(56) References Cited

U.S. PATENT DOCUMENTS

| | | | |
|---|---|---|---|
| 4,394,673 A | 7/1983 | Thompson et al. |
| 4,618,381 A | 10/1986 | Sato et al. |
| 4,693,543 A | 9/1987 | Matsumura et al. |
| 4,715,672 A | 12/1987 | Duguay et al. |
| 4,787,691 A | 11/1988 | Lorenzo et al. |
| 4,789,642 A | 12/1988 | Lorenzo et al. |
| 4,959,694 A | 9/1990 | Gell |
| 4,997,246 A | 3/1991 | May et al. |
| 5,002,350 A | 3/1991 | Dragone |
| 5,033,816 A | 7/1991 | Blondeau et al. |
| 5,039,190 A | 8/1991 | Blonder et al. |
| 5,107,538 A | 4/1992 | Benton et al. |
| 5,119,460 A | 6/1992 | Bruce et al. |
| 5,181,211 A | 1/1993 | Burnham et al. |
| 5,262,656 A | 11/1993 | Blondeau et al. |
| 5,282,260 A | 1/1994 | Buchal et al. |
| 5,351,146 A | 9/1994 | Chan et al. |
| 5,355,237 A | 10/1994 | Lang et al. |
| 5,357,591 A | 10/1994 | Jiang et al. |
| 5,468,684 A | 11/1995 | Yoshimori et al. |
| 5,473,174 A | 12/1995 | Ohsawa |
| 5,534,079 A | 7/1996 | Beach |
| 5,594,750 A | 1/1997 | Zhang et al. |
| 5,634,973 A | 6/1997 | Cabral, Jr. et al. |
| 5,646,425 A | 7/1997 | Beach |
| 5,647,038 A | 7/1997 | Minden et al. |
| 5,667,905 A | 9/1997 | Campisano et al. |

(Continued)

FOREIGN PATENT DOCUMENTS

EP 0 474 447 A1 3/1992

(Continued)

OTHER PUBLICATIONS

Favennec, et al. "Optical Activation of ER Implanted in Silicon by Oxygen Impurities." Japanese Journal of Applied Physics, vol. 29, No. 4, Apr. 1990, pp. L 524-L526.

(Continued)

*Primary Examiner*—Jerome Jackson
(74) *Attorney, Agent, or Firm*—Fernandez & Associates, LLP

(57) ABSTRACT

Structure and method for growing crystalline superlattice rare earth oxides, rare earth nitrides and rare earth phosphides and ternary rare-earth compounds are disclosed. The structure includes a superlattice having a plurality of layers that forming a plurality of repeating units. At least one the layers in the repeating unit is an active layer with at least one species of rare earth ion.

43 Claims, 23 Drawing Sheets

U.S. PATENT DOCUMENTS

| | | | |
|---|---|---|---|
| 5,719,077 | A | 2/1998 | Chakrabarti et al. |
| 5,719,416 | A | 2/1998 | Yoshimori et al. |
| 5,841,931 | A | 11/1998 | Foresi et al. |
| 5,852,346 | A | 12/1998 | Komoda et al. |
| 5,917,195 | A | 6/1999 | Brown |
| 5,920,078 | A | 7/1999 | Frey |
| 5,942,050 | A | 8/1999 | Green et al. |
| 6,058,131 | A | 5/2000 | Pan |
| 6,069,908 | A | 5/2000 | Yuen et al. |
| 6,403,975 | B1 | 6/2002 | Brunner et al. |
| 6,456,423 | B1 | 9/2002 | Nayfeh et al. |
| 6,846,509 | B1* | 1/2005 | Chen et al. .................. 427/66 |
| 2002/0017657 | A1 | 2/2002 | Coffa et al. |
| 2002/0096675 | A1 | 7/2002 | Cho et al. |
| 2002/0117673 | A1 | 8/2002 | Moon |
| 2002/0131663 | A1 | 9/2002 | Marks et al. |
| 2002/0155673 | A1 | 10/2002 | Camalleri et al. |
| 2004/0106285 | A1* | 6/2004 | Zacharias .................. 438/689 |

FOREIGN PATENT DOCUMENTS

| | | |
|---|---|---|
| EP | 0 517 440 A2 | 12/1992 |
| EP | 0 578 407 A1 | 1/1994 |
| JP | 05283743 | 10/1993 |

OTHER PUBLICATIONS

Ennen, et al. "1.54 um Luminescence of Erbium-Implanted III-V Semiconductors and Silicon." Applied Physics Lett. 43 (10), Nov. 15, 1983, pp. 943-945.

Shin, et al. "Controlling the quantum effects and erbium-carrier interaction using Si/SiO2 superlattices." Proc. SPIE vol. 4282, pp. 142-152.

Han, et al. "Control of Location and Carrier-Interaction of Erbium Using Erbium-Doped Si/SiO2 Superlattice." Thin Films for Optical Waveguide Devices Symposium Z Dec. 1999.

Orlov, et al. "Comparative Analysis of Light Emitting Properties of Si: Er and Ge/Si Ge Expitaxial Structures Obtained by MBE Method." Solid State Phenomena vols. 69-70, 1999.

Pool, Rebecca. "Scientists Predict Silicon Debut." OLE, Jan. 2002, pp. 31.

Huang, et al. "Field-Induced Waveguides and Their Application to Modulators." IEEE Journal of Quantum Electronics, vol. 29, No. 4, Apr. 1993, pp. 1131-1143.

Mendoza-Alvarez, et al. "Analysis of Depletion Edge Translation Lightwave Modulators." Journal of Lightwave Technology., vol. 6, No. 6, Jun. 1998, pp. 793-807.

Huang, et al. "Depletion Edge Translation Waveguide Crossing Optical Switch." IEEE Photonics Technology Letters, vol. 1, No. 7, Jul. 1989, pp. 168-170.

Tomomi,et al. "Reflection-type 2×2 optical waveguide switch using the Goos-Hanchen shift effect." Applied Physics Letter, vol. 76, No. 20, May 15, 2000, pp. 2841-2843.

Bieber, et al. "Optical Switching in a Metal-Semiconductor-Metal Waveguide Structure." Applied Physics Letter, 66 (25), Jun. 19, 1995, pp. 3401-3403.

Jalali, et al. "Advances in Silicon-on-Insulator Optoelectronics." IEEE Journal of Selected Topics in Quantum Electronics, vol. 4, No. 6, Nov./Dec. 1998, pp. 938-947.

Benaissa, et al. "IC Compatible Optical Coupling Techniques for Integration of Arrow with Photodetector." Journal of Lightwave Technology, vol. 16, No. 8, Aug. 1998, pp. 1423-1432.

Baba, et al. "Dispersion and Radiation Loss Characteristics of Antiresonant Reflecting Optical Waveguides-Numerical Results and Analytical Expressions." IEEE Journal of Quantum Electronics, vol. 28, No. 7, Jul. 1992, pp. 1669-1700.

Mao, et al. "An Arrow Optical Wavelength Filter: Design and Analysis." Journal of Lightwave Technology, vol. 11, No. 7, Jul. 1993, pp. 1183-1188.

Delisle, et al. "High Finesse Wavelength Selective Coupler Based on ARROW'S." IEEE Photonics Technology Letters, vol. 8., No. 6, Jun. 1996, pp. 791-793.

Chu, et al. "Compact ARROW-Type Vertical Coupler Filter." IEEE Photonics Technology Letters, vol. 8, No. 11, Nov. 1996, pp. 1492-1494.

Kubica, et al. "A Rigorous Design Method for Antiresonant Reflecting Optical Waveguides." IEEE Photonics Technology Letters, vol. 6, No. 12, Dec. 1994, pp. 1460-1462.

Chu, et al. "ARROW-Type Vertical Coupler Filter: Design and Fabrication." Journal of Lightwave Technology, vol. 17, No. 4, Apr. 1999, pp. 652-658.

Benaissa, et al. "IC Compatible techniques for coupling light from arrow to integrated photodiodes." The Institution of Electronic Engineers, 1994, pp. 11/1-11/6.

Mao, et al. "In-line fiber-optic filter using GaAs ARROW waveguide." CLEO'98, May 7, 1998 (Thursday Afternoon), pp. 424-425.

Goh, et al. "Estimation of Waveguide Phase Error in Silica-Based Waveguides." Journal of Lightwave Technology, vol. 15, No.11, Nov. 1997, pp. 2107-2113.

Maru, et al. "Influence of statistical amplitude and phase errors on spectral response of arrayed-waveguide grating." Electronics Letters, vol. 35, No. 22, Oct. 28, 1999, pp. 1967-1969.

Tsuda, et al. "Second- and Third-Order Dispersion Compensator Using a High-Resolution Arrayed-Waveguide Grating." IEEE Photonics Technology Letters, vol. 11, No. 5, May 1999, pp. 569-571.

Baba, et al. "New Polarization-Insensitive Antiresonant Reflecting Optical Waveguide (ARROW-B)." IEEE Photonics Technology Letters, vol. 1, No. 8, Aug. 1989, pp. 232-234.

Pezeshki, et al. "Wavelength-selective waveguide photodetectors in silicon-on-insulator." Appl. Phys. Letter, 68(6), Feb. 5, 1996, pp. 741-743.

Khan, et al. "Mode-Coupling Analysis of Multipole Symmetric Resonant Add/Drop Filters." IEEE Journal of Quantum Electronics, vol. 35, No. 10, Oct. 1999, pp. 1451-1460.

Chu, et al. "Cascaded Microring Resonators for Crosstalk Reduction and Spectrum Cleanup in Add-Drop Filters." IEEE Photonics Technology Letters, vol. 11, No. 11, Nov. 1999, pp. 1423-1425.

Lee, et al. "Analysis of N×N Passive Optical Star Coupler Based on the Normal Modes of N Input Waveguides." Journal of Lightwave Technology, vol. 10, No. 12, Dec. 1992, pp. 1800-1806.

Sayah, et al. "Realisation of Silicon Based Dielectrics Anti-Resonant Reflecting Optical Waveguide (ARROW) on InP by Photochemical Deposition." Tup-D9, pp. 315-318.

Kaneko, et al. "Design and Applications of Silica-Based Planar Lightwave Circuits." IEEE Journal of Selected Topics in Quantum Electronics, vol. 5, No. 5, Sep./Oct. 1999.

Cutolo, et al. "Silicon Electro-Optic Modulator Based on a Three Terminal Device Integrated in a Low-Low Single-Mode SOI Wavegide." Journal of Lightwave Technology, vol. 15.

Soldano, et al. "Optical Multi-Mode Interference Devices Based on Self-Imaging: Principles and Applications." Journal of Lightwave Technology, vol. 13, No. 4, Apr. 1995.

Lockwood, David. "Light Emisssion in Silicon: From Physics to Devices." Semiconductors and Seminars, vol. 49, Academic Press, 1998.

* cited by examiner

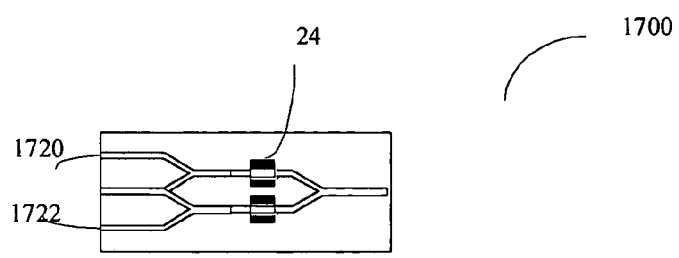
Figure 17
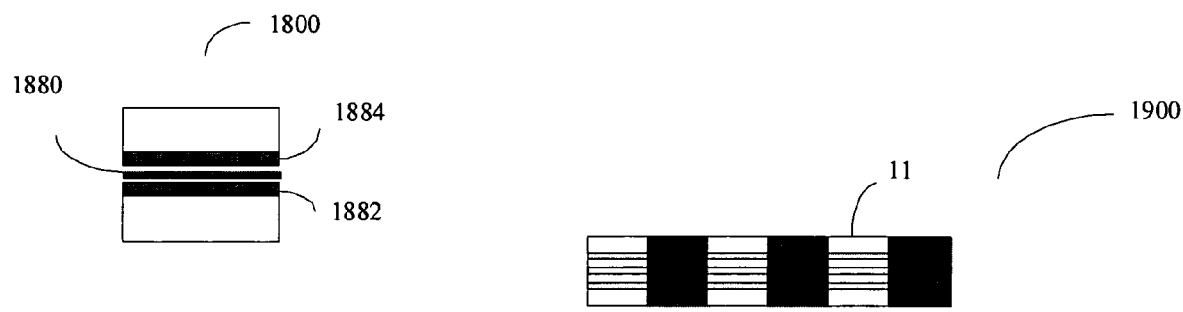
Figure 18
Figure 19

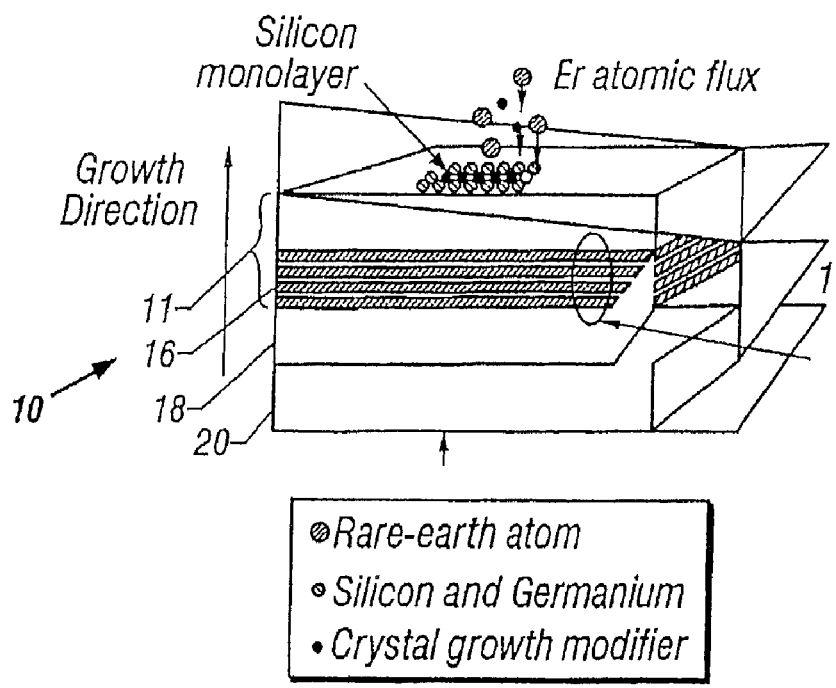
FIG. 24 A
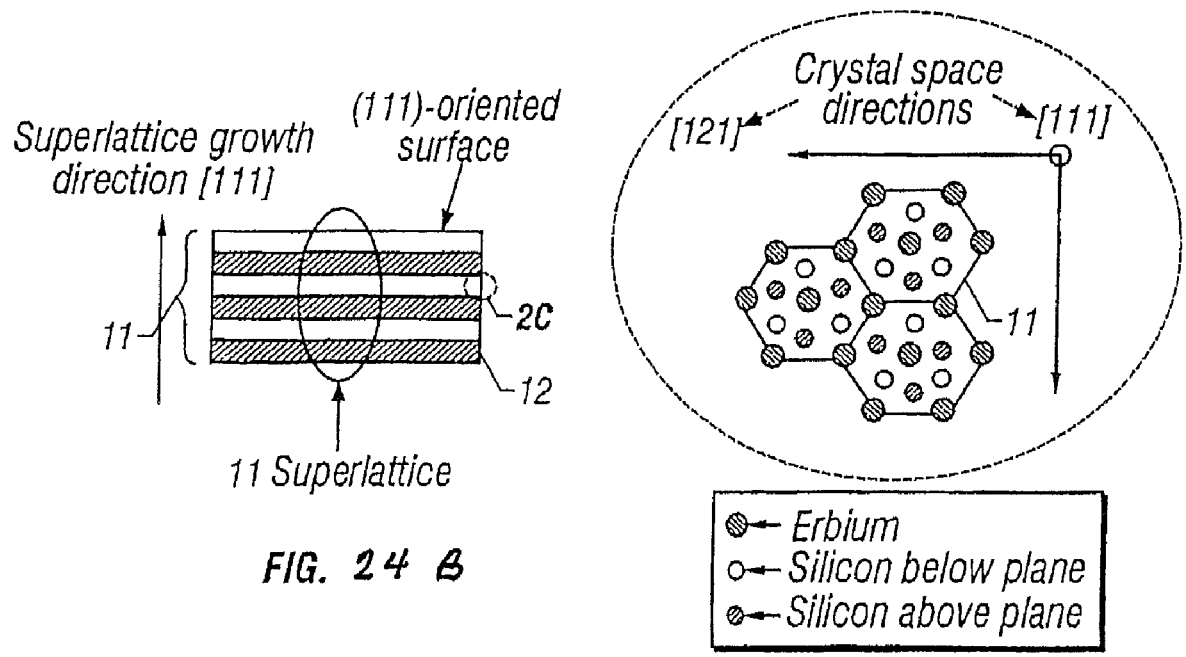
FIG. 24 B
FIG. 24 C

METHOD AND APPARATUS FOR GROWTH OF SINGLE-CRYSTAL RARE-EARTH OXIDES, NITRIDES, AND PHOSPHIDES

CROSS REFERENCE TO RELATED APPLICATIONS

This application is a continuation-in-part of U.S. patent application Ser. No. 09/924,392 filed on Aug. 7, 2001 now U.S. Pat. No. 6,734,453 which claims the benefit of U.S. provisional application Ser. No. 60/223,874 filed on Aug. 8, 2000 which is fully incorporated herein by reference.

FIELD OF INVENTION

Invention relates to development of crystalline oxides, nitrides, phosphides and more particularly to development of crystalline rare earth oxides, nitrides, and phosphides.

BACKGROUND OF INVENTION

In order to make next generation of devices the silicon industry must aggressively reduce the thickness of $SiO_2$ or $SiO_xN_y$ gate dielectrics to approximately 1 nm. Such small gate oxide thickness in ultra-large-scale-integrated circuits (ULSICs) and VLSI have negative consequences. Namely, reduced oxide reliability, lower breakdown strength and higher leakage tunneling currents. These limitations put extreme restrictions on conventional field effect transistor (FET) scalability. To solve the 'gate oxide problem' alternative gate oxides with high-k dielectric constant have been tried. However most high-k dielectrics found are amorphous and lack the required valence and conduction band offsets when hetero-junctions with Si are formed. Furthermore, the interface quality of high-k/Si junctions is automatically rougher than the simple native $SiO_2$/Si system.

One of the other prior art techniques included sputtering which resulted in polycrystalline form and that is not suitable for ULSICs or VLSI.

Other existing solutions include the fabrication of a different type of FET, called a FinFET, which is a double or even triple vertical gate FET. This technology requires the use of high quality silicon-on-insulator (SOI) technology. Typically, high quality SOI substrates are formed via the SIMOX process, where oxygen is implanted through the surface of a Si wafer to an appropriate depth and thickness. The resulting defective top most Si layer is subsequently repaired to high mobility silicon via extensive thermal annealing processes.

Another potential use of developing crystalline oxides, nitrides and phosphides is in the area of optoelectronics. Communication networks increasingly rely upon fiber optics for high-speed, low cost transmission. For this, efficient and inexpensive electrically driven planar photonic devices operating at fiber communication wavelengths are needed.

Accordingly, there is a need for materials which can be relatively easily integrated with Si-based electronics manufacturing. Development of such material can also lead to reduction of manufacturing costs. Moreover, there is a need in the industry to design devices with desired wavelength.

SUMMARY OF INVENTION

Accordingly, an object of the present invention is to provide a superlattice that includes multiple layers that form multiple repeating units, with at least one of the layers in the repeating unit is an active layer containing at least one species of rare earth ion oxide.

Another object of the present invention is to provide a super lattice that includes multiple layers that form a multiple repeating units, with at least one of the layers in the repeating unit is an active layer containing at least one species of rare earth ion nitride.

Another object of the present invention is to provide a super lattice that includes multiple layers that form a multiple repeating units, with at least one of the layers in the repeating unit is an active layer containing at least one species of rare earth ion phosphide.

Another object of the invention is to provide a method of growing a rare earth ion oxide superlattice structure on a silicon substrate.

Another object of the invention is to provide a method of growing a strain symmetrized rare earth ion oxide superlattice structure.

Another object of the invention is to provide method of growing a rare earth ion nitride superlattice structure.

Another object of the invention is to provide a silicon on insulator structure having a rare earth oxide layer.

Another object of the invention is to provide a high-k dielectric structure having a rare earth oxide layer.

BRIEF DESCRIPTION OF THE DRAWINGS

FIG. 17 is a perspective view of a wavelength converter embodiment of the present invention.

FIG. 18 is a perspective view of a parametric non-linear optical element of the present invention.

FIG. 19 is a perspective view of a quasi-phase-matched nonlinear element embodiment of the present invention.

FIGS. 24 A, B and C show schematically rare-earth atoms incorporated into a superlattice with silicon, germanium and crystal growth modifier atoms.

DETAILED DESCRIPTION OF PREFERRED EMBODIMENT(S)

When rare earth ions are suitably activated in the triply ionized state, optical absorption and emission of the 4f-shell manifold is possible. Such rare earth ions include Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy). Holmium (Ho), Erbium (Er), Thulium (Tm), Ytterbium (Yb) and Luthium (Lu). Particularly, Erbium has been found to oxidize, nitride and phosphate readily in a suitably activated atomic oxygen/nitrogen/phosphor, metastable oxygen molecular oxygen/nitrogen/phosphor and or oxygen oxynitride or oxyphosphide environement. Further, new forms of c-rare earth oxide, c-rare earth nitride, c-rare earth phosphate may be grown on a silicon substrate.

FIGS. 1A–D, show perspective views of structures for the epitaxial c-ErOx. The energy momentum calculation made using a density functional theory plane-wave pseudopotential method and self-consistent minimization, shows that c-ErOx has a quantitatively different band structure to that of bulk Si. This is primarily due to the type atomic symmetry and bonding. The band gap of c-ErOx is 6 eV therefore, expected to have refractive index much lower than that of Si. As used herein "ErOx" refers to erbium oxide of varying compositions; stoichiometric erbium oxide is $Er_2O_3$; "ErOx" comprises compositions ranging from x greater than zero to $\leq 3$.

Figure 1A:
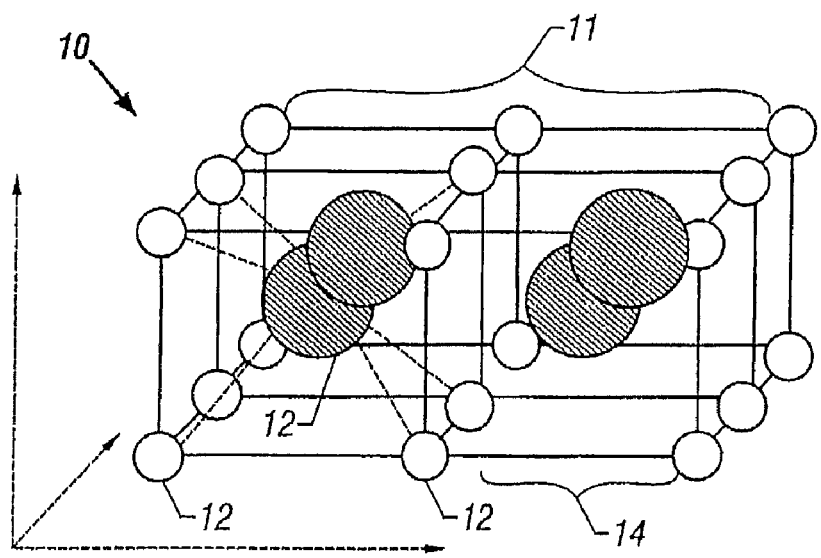
FIG. 1(a) is a perspective view of a superlattice structure of the present invention illustrating one embodiment of a crystalline structure.
Figure 1B:
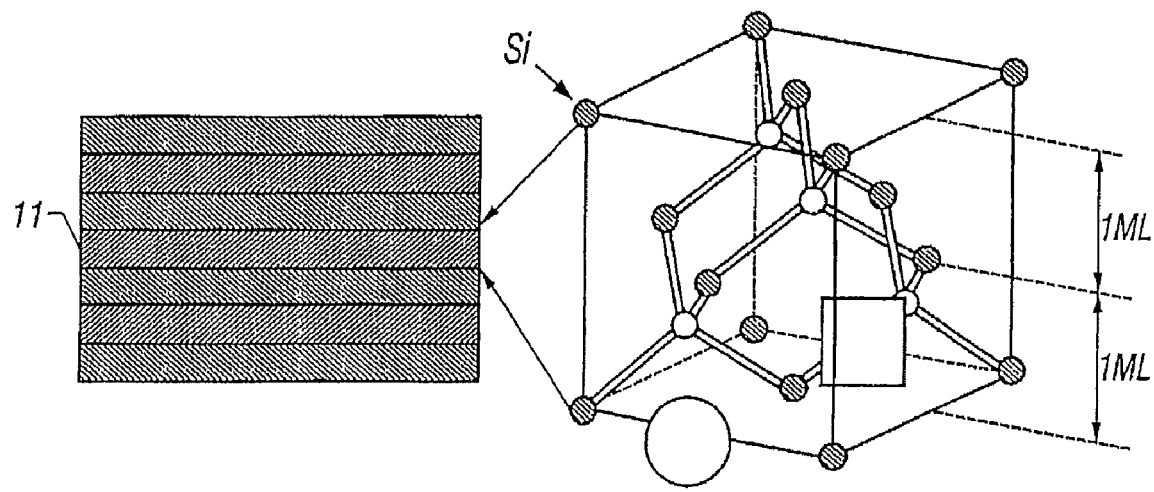
FIG. 1(b) is a perspective view of a superlattice of the present invention illustrating an erbium trivalent ion inside an active region layer that generates a crystal field.
Figures 1C, 1D:
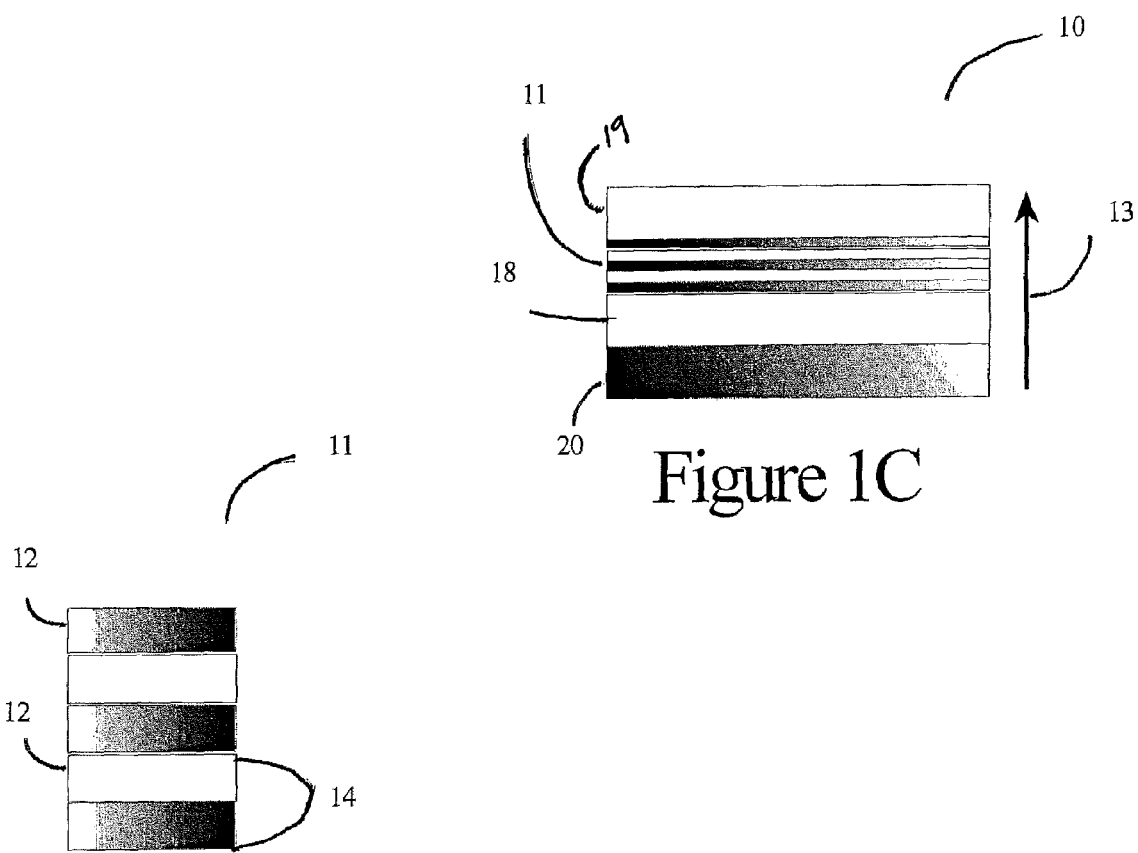
FIGS. 1c and d show alternative superlattice configurations.

FIG. 1a shows a device 10, that includes a superlattice 11. Superlattice 11 shown in FIG. 1b includes plurality of individual layers 12 that form a plurality of repeating units 14. At least one of layers 12 is an active region layer with at least one species of rare earth ion. The rare earth ion comprises rare earth oxide, and/or rare earth nitride, and/or rare earth phosphide and/or combination thereof. FIG. 1C shows a schematic structure of device 10 comprising substrate 20, buffer or spacer layer 18, superlattice 11, capping layer 19; growth direction 13 is also shown. FIG. 1D shows a schematic structure of alternative device 11 comprising repeating units 14 and a final active region layer 12.

Preferably repeating units are periodic. At least a portion of active region layer can be a narrow or wide band gap semi conductor.

In one embodiment superlattice 11 includes at least one amorphous layer 12. In another embodiment, at least one of the layers in at least one repeating unit 14 has an amorphous layer 12. At least one crystal growth modifier can be included in an individual layer 12 of each repeating unit 14. Suitable growth modifiers include but are not limited to C, As, B, H, Sn, Pb and the like. Additionally during deposition of each layer 12, additional iso-electronic centers can be added, to enhance or activate the rare-earth and control the deposition growth or surface structure of the atoms.

In one embodiment superlattice 11 consists of dissimilar materials of type A, B, and C in repeating units 14, for example of the type (ABA . . . ABA), or (ABCABC . . . ABC). The number and composition of repeating units 14 is determined by the rare-earth ion interaction cross-section or density required; i.e., to increase interaction cross-section, either the number of layers is increased, or the rare earth density in each active layer is increased, or a combination of both. The density of the rare-earth ion is determined by the stoichiometry of the layer 12 which includes ions of rare earth oxide, and/or nitride, and/or phosphide and/or a combination thereof.

The device 10 can have at least one spacer layer 18 between two adjacent repeating units 14 or between more than one pair of adjacent repeating units including all adjacent repeating units. The spacer layer is used to improve the structural quality, symmetry, optical quality or electronic quality of the superlattice. Additionally, superlattice 11 can be positioned or grown on a substrate 20, including but not limited to a silicon substrate, or on a pseudo-substrate buffer layer (not shown) that has a lattice constant of the bulk substrate, preferably silicon. Where a pseudo substrate is defined as thick layer with low defect surface density that is grown over the substrate.

Repeating units 14 can have: (i) uniform layer constructions, (ii) non-uniform layer constructions, (iii) thickness that vary as a function of distance along a superlattice growth directions, (iv) layer chemical compositions and layer thickness that vary as a function of distance along a superlattice growth, (v) at least two individual layers 12, (vi) at least two individual layers 12 that have different thickness, (vii) at least two individual layers 12 that are made of different compositions, (viii) at least three individual layers 12 that are made of different composition, (ix) a semiconductor layer 12 that includes rare earth oxide, and/or nitride, and or phosphide or a combination thereof (x) a semiconductor germanium layer 12 (xi) a rare earth silicide layer 12 (xii) an oxygen doped semiconductor layer 12 (xiii) an electrically doped p-or n-type layer 12 or (xvi) hydrogenated semiconductor layer 12, hydrogenated semiconductor oxide, hydrogenated semiconductor nitride, hydrogenated semiconductor phosphide, or a combination thereof, the same thickness and a thickness of the individual layers of the repeating units varies as a function of distance along a superlattice growth direction.

At least a portion of repeating units 14 can have different thickness, such superlattice 11 may be varied adjusted to control structural, electrical and optical properties that vary in the growth process. Each repeating unit can be repeated N times, where N is a whole or partial integer. Repeating units 14 can be made of layers 12 that are thin. In one embodiment, the thin layers 12 have a thickness of 1000 Å or less and in another embodiment they are thin enough to be non-bulk material layers 12.

In one embodiment superlattice 11 is grown on a semiconductor substrate along the direction indicated by arrow 13. The growth of lattice matched and/or lattice mismatched layers 12 can be epitaxially grown on a semiconductor substrate or on a pseudo substrate that can be a bulk or superlattice strained or relaxed buffer layer. In another embodiment, the rare earth ion has an energy level that is determined by a geometric symmetry of a crystal field produced by the constituent atomic arrangement and layer geometry of the superlattice 11.

The configuration of the superlattice 11 may be modified according to the desired structural, electrical and optical properties. This is achieved by the growth of several superlattices on top of each other, with each superlattice being a constant composition of repeating units 14 but the number of repeating units 14 can vary in each superlattice. Alternatively, the thickness and chemical composition of the individual layers may also be modified according to the desired properties.

As can be seen from above the present invention is indiscriminant in terms of growing thick or thin single crystal superlattice rare earth oxides, nitrides and phosphides. The superlattice thickness may exceed 1 micron depending on the application. Such bulk single crystal superlattice structures are extremely useful when it comes to developing next generation devices.

Active layer is not limited to a specific type of rare earth ion. It may include more than one kind of rare earth ions. This facilitates optical and electrical pumping of one ion by energy transfer from the other ion. Additionally, the active layer can have a lattice constant substantially different to bulk semiconductor substrate. Varying the lattice constant enables the electrical and optical properties to be adjusted and optimized.

Figure 2:
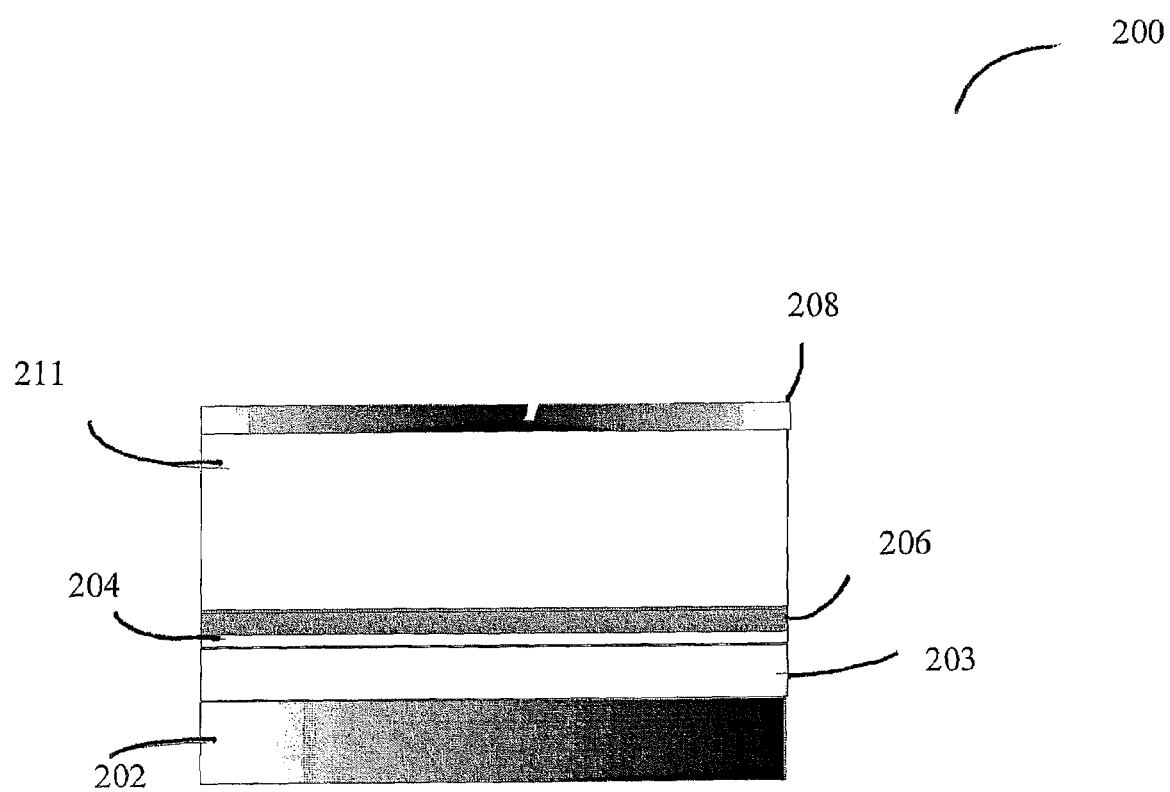
FIG. 2, shows a structure having a crystal rare earth oxide superlattice structure 211 grown on a silicon (111) substrate.

FIG. 2, shows a structure 200 having a crystal rare earth oxide superlattice structure 211 grown on a, for example, silicon (111) substrate 202. The structure 200 includes a layer of Si(111) substrate 202 followed by a Si buffer layer 203 on top of 202. The structure 200 further includes a layer of crystalline rare earth silicide layer 204 that serves as a seed layer for single crystal growth. The next layer above is a silicide interfacial layer (c-Si[RE]x) 206 to be used as a template for growing the rare earth oxide superlattice structure 211. Finally the structure may be capped with a crystalline silicon, for example, layer 208. As used herein "Si[RE]x" refers to rare-earth, [RE], suicides of varying composition with lesser or greater amounts of rare-earth to silicon ratios than the stoichiometric ratio.

The real time growth of c-ErOx has been monitored using near-normal incidence reflectivity shows a large change in refractive index between Si and c-ErOx. Even though in this embodiment as well as in others Si substrate is shown as an example, other types of semiconductor materials may be use instead of silicon. For example, gallium arsenide, gallium nitride, aluminum gallium arsenide, indium phosphide etc. are all possible substitutes for silicon.

Figure 3:
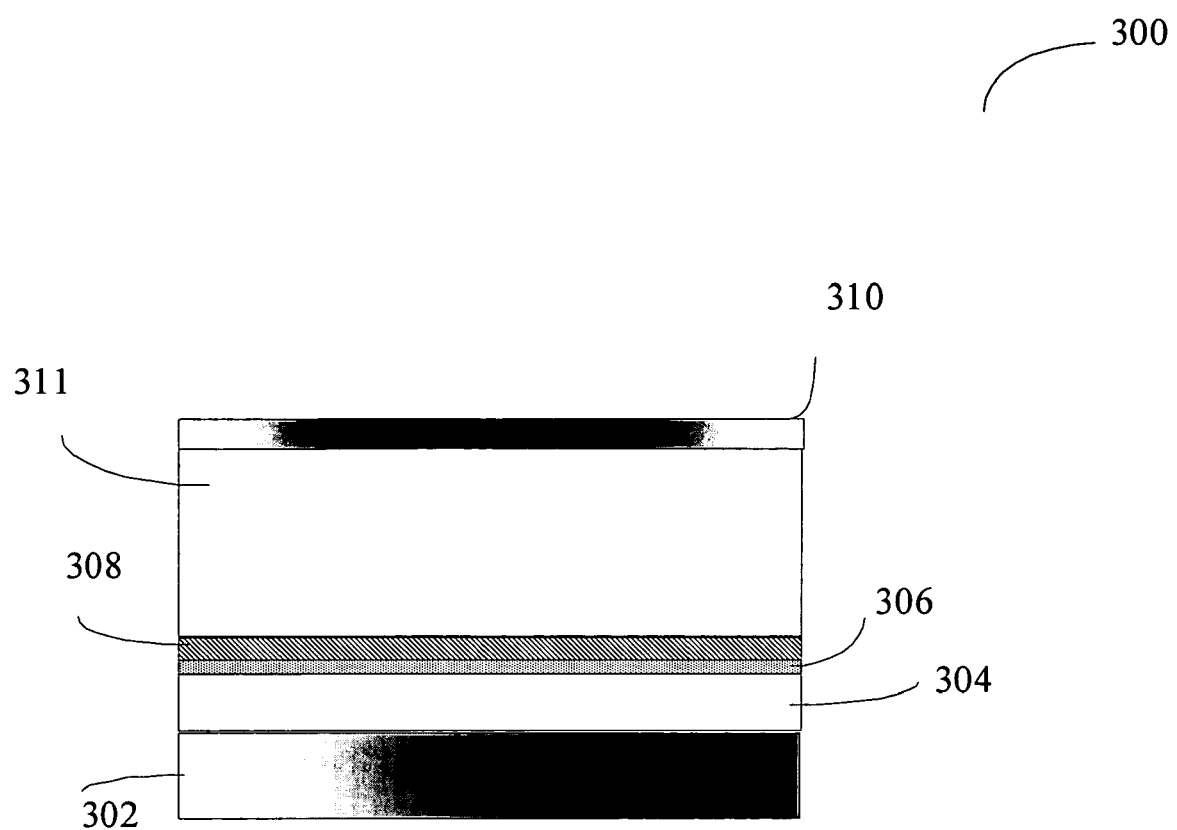
FIG. 3, shows a structure having a crystal rare earth oxide superlattice structure grown on silicon (100) substrate.

FIG. 3, shows a structure 300 having a crystal rare earth oxide superlattice structure 311. The structure 300 includes a layer of Si(100) 302 followed by an Si buffer layer 304 on top. Upon the Si buffer layer is a crystalline rare earth silicide layer 306 that serves as a seed layer for single crystal growth. The next layer on top of the silicide layer is an interfacial layer of $Si_{1-y}$(rare earth oxide)$_y$ layer 308 which to be used as a template to grow the rare earth oxide superlattice 311. Following the interfacial layer is the superlattice, 311 containing the rare earth oxide. The structure 300 is annealed with a crystalline silicon cap 310.

The growth of lattice matched and/or mismatched layers can be epitaxially grown on a substrate that can be bulk or superlattice strained or relaxed buffer layer. In various embodiments, active layer has a lattice layer that is less than, the same as or equal to a lattice constant of a silicon substrate or pseudo substrate buffer layer. It may be preferred for active region layer containing the rare earth oxide atoms to be in a mechanically stressed state when grown epitaxially on silicon substrate or pseudo substrate by either tension, lattice mismatching or compression. This reduces the defect density, which in turn improves structural quality.

With referring back to FIG. 1a, in certain embodiments, at least one layer in a repeating unit 14 has a lattice constant that is sufficiently different from (i) a lattice constant of substrate 20 to have an opposite state of mechanical stress or (ii) a lattice constant of pseudo-substrate buffer layer (not shown) to have an opposite state of mechanical stress. In one embodiment at least two layers 12 of repeating units 14 have substantially equal and opposite mechanical strain states and (i) each repeating unit 14 is substantially lattice matched to pseudo-substrate buffer layer (not shown).

For silicon, the c-rare earth oxide layer is primarily in the state of tension. The tension can be balanced by the growth of an equal but opposite strain using for example, germanium. The thickness of the germanium Ge layer is tuned to counteract the tensile force of the rare earth oxide layer with an equal but opposite compressive force. The thickness of the Ge layer is maintained to have a thickness below the critical layer thickness but are thick enough to generate a compressive strain such as to reduce or even cancel the tensile strain of the c-rare earth oxide, rare earth nitride or rare earth phosphide layer. The tensile and compressively strained layer pairs can be repeated N times where N can be a very large number such that the total thickness of the resulting superlattice is several orders of magnitude larger than the critical layer thickness of individual strained layers. Such a large structure may have potentially interesting induced crystal field splitting effects on the 4-f manifold energies. In this embodiment, the pseudomorphically strain balanced superlattice can be grown free of interfacial misfit dislocations and thus substantially free of surface states and trap level defects. This type of strain balanced growth further reduces the segregation problem of epitaxial growth using impurities or rare-earth ions by periodically trapping the rare-earth oxide, nitride, and phosphide ions below rare-earth deficient semiconductor based layers. This method substantially solves the problem during epitaxial growth of layers involving segregating species as they behave as a surfactant and are thus difficult to incorporate at high densities.

Figure 4:
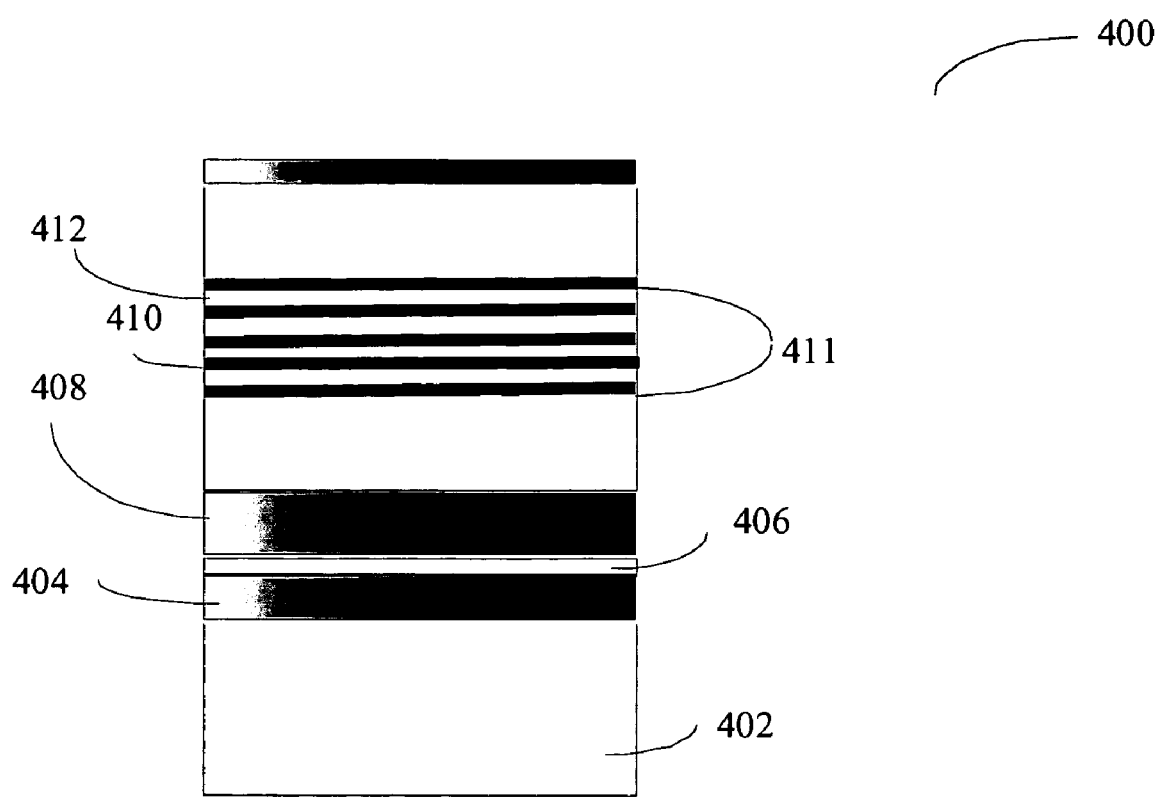
FIG. 4 shows a structure 400 that includes strain symmetrized rare earth ion superlattice.

FIG. 4 shows a structure 400 that includes strain symmetrized rare earth oxide superlattice 411. The structure 400 shows a silicon substrate layer 402 at the bottom followed by a Si buffer layer 404 that is followed by silicide rare earth layer 406 which forms a seed layer. The structure 400 further includes a Si rare earth oxide layer 408 on top the silicide layer 406 that may be used as a template to grow the strain symmetrized rare earth oxide superlattice 411. The superlattice 411 includes a unit having multiple bilayers of rare earth oxide 410 and germanium. Germanium layers 412 are used here to balance the tensile strain.

Figure 5A:
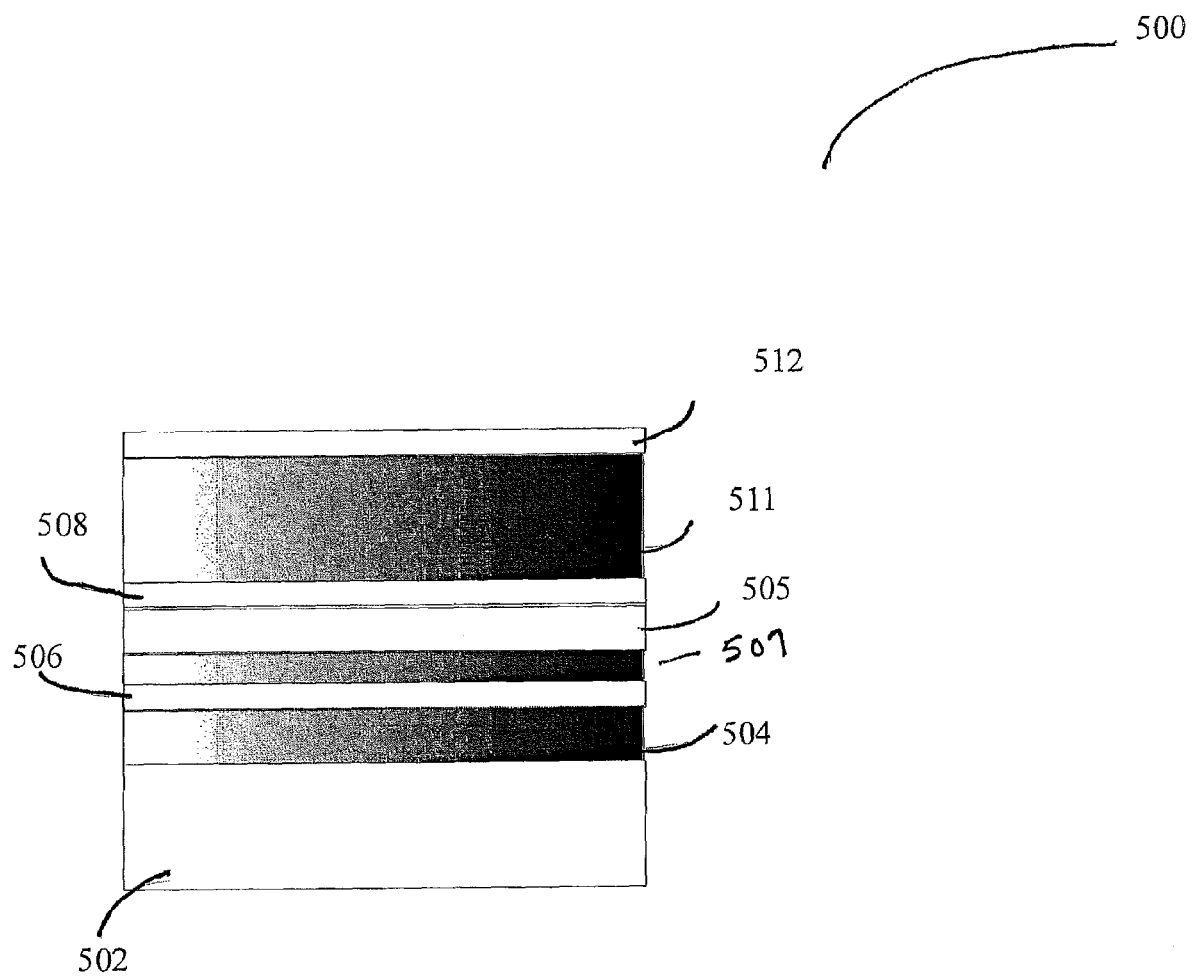
FIG. 5A shows a structure 500 that includes rare earth nitride superlattice.

Nitrogen has a large affinity for electrons and readily forms a nitride. FIG. 5A shows a structure 500 that includes rare-earth nitride superlattice 511. The structure 500 shows a substrate layer 502 at the bottom followed by a Si buffer layer 504 that is followed by a silicide rare earth layer 506 which forms a seed layer. The structure 500 further includes a Si rare earth oxide layer 507 on top of the silicide rare earth layer 506 that may be used as a template. A c-rare earth oxide buffer layer 505 on the template layer 507 is used to initiate epitaxy of the rare earth nitride layer. The structure further includes the grown c-rare earth nitride layer 511 on top of the c-rare earth oxide buffer layer. The structure is capped by an annealing layer 512 of, alternatively, pc-Si. As used herein "pc-" refers to poly-crystalline.

Figure 5B:
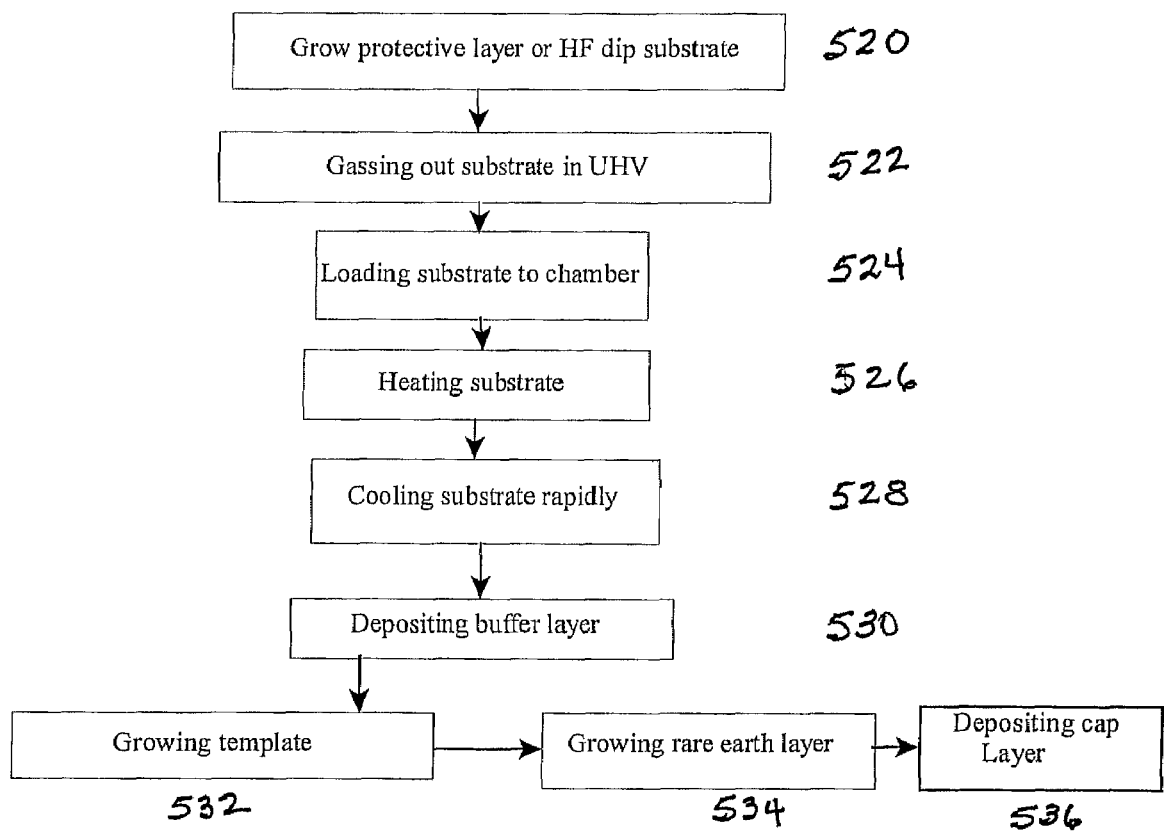
FIG. 5B illustrates the steps involved in a method for growing bulk single crystal rare earth oxide, rare earth nitride rare earth phosphides, or a combination thereof.

The next embodiment of the present invention includes a method of growing bulk single crystal rare earth oxide, rare earth nitride rare earth phosphide, or a combination there of. The method as illustrated in FIG. 5B comprises the step 520 of terminating a semiconductor substrate surfaces with either a wet grown protective layer or with hydrogen using a HF dip. Then gassing out the substrate in UHV as illustrated in 522 and loading it to the growth chamber as shown in 524. After that in step 526, heating the substrate to about 900° C. or until a clear 7×7 surface reconstruction was observed. Subsequently, cooling the substrate rapidly to growth temperature in step 528. Then in step 530, depositing a 1000 Å buffer layer on top of the substrate. Then in step 532 growing a thermodynamically stabilized sequence of layers thus establishing a template to enable the growth of a pseudomorphic c-rare earth oxide layer. After that in step 534 growing the c-rare earth oxide layer on top of the template. Subsequent to growth, depositing a silicon cap layer with a thickness of about 200 Å in step 536.

The c-rare earth oxide growth parameters can be manipulated such that the growth proceeds in a 2-dimensional layer-by-layer mode, controlled primarily by the deposition rate.

Thus far the embodiments have been directed to electrical and electronic devices. It is understood that the invention is not limited to electrical and electronic devices, for example, the same device 10 can be used in optical devices as well.

In various embodiments the device 10 can produce optical gain to drive a laser emission at a preferred wavelength, for example 1500 to 1650 nm, amplify an incident optical signal, overcome optical losses of other system elements, or detect an optical signal at preferred wavelength. The invention utilizes manipulation in the atomic scale while taking advantage of periodicity of changing composition to design devices of any wavelength by tailoring the optical radiation of the material.

Figure 6:
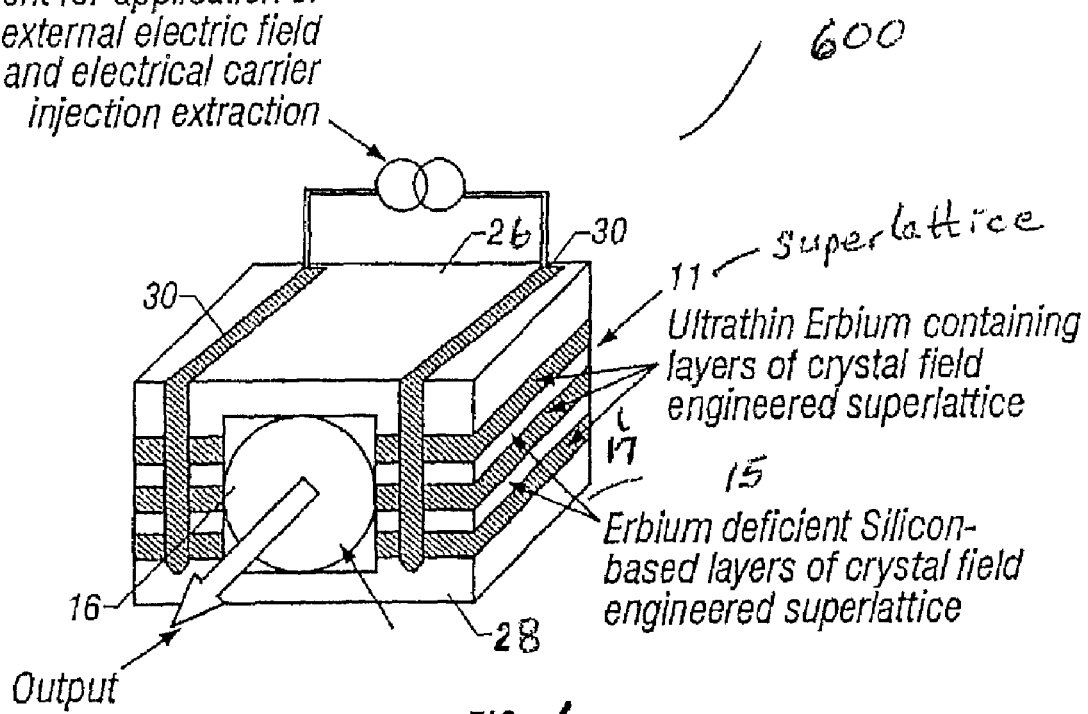
FIG. 6 is a schematic diagram of an embodiment of an optical device of the present invention electrodes and a core structure that can include alternating layers of silicon or silicon based compositions and rare earths.

Referring to FIG. 6, the device 10 is an optical gain/loss device 600 that has a core superlattice structure 601 with alternating layers 602 of semiconductor or semiconductor based compositions and rare earth oxide, or nitride, or phosphide 604 or combination thereof. The rare earth oxide can be capped with top and bottom layers 606 and 608 and that can be semiconductor layers. Electrical contacts 610 are applied by implanting electrical dopants including, but not limited to, rare earths or metals, to form low Schottky barrier silicides through top cap 606 into a core of superlattice 601. Electrical contacts 610 can be implanted. This implantation method is described in U.S. Pat. No. 4,394,673, incorporated herein by reference. Rare earth oxide, nitride or other rare-earth silicide is a suitable material for electrical contacts 610 because it is ideal for high speed operation of optical gain/loss device 600 due to the superior ohmic contact resistance of the material. Such materials include di-silicides, refractory metals and aluminum.

Optical gain/loss device 600 can be a waveguide for optical propagation by mode confinement through a refractive index change. Planar electrical devices using monolithic approaches involving selective implantation can be utilized with waveguide 600 including, but not limited to, planar, or lateral, p-i-n, n-i-n or p-i-p. The in-plane carrier mobility of superlattice 601 is generally higher than vertical transport in a direction perpendicular to layers 602 and 604. The present invention can also be a hybrid HBT or HFET device that provides multi-electro-optic mode control. This can be achieved by incorporating in-plane carrier extraction and injection using electrical contacts 610 in conjunction with the electric fields that are produced above and below superlattice 601.

Figure 7A:
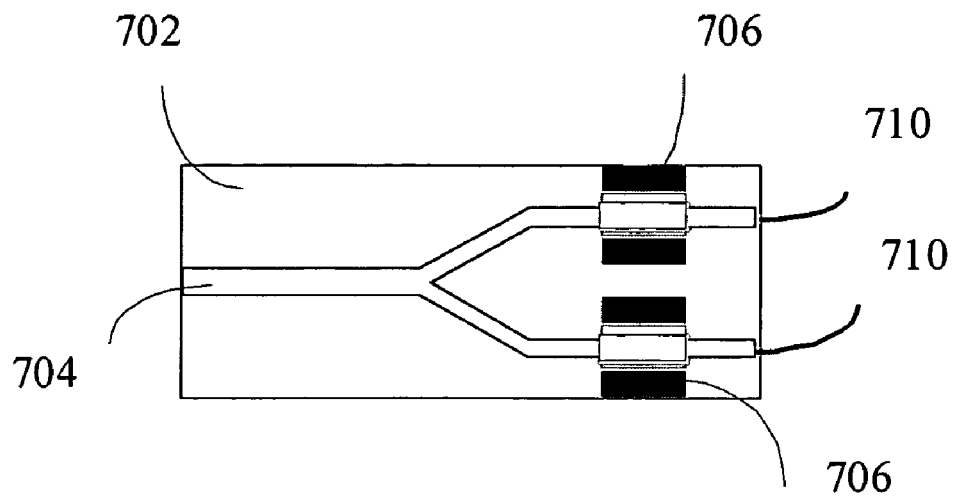
FIG. 7(a) is a perspective view of a switch embodiment of the present invention.

In one embodiment, illustrated in FIG. 7(a), optical device is a switch 700. At least two optical gain/loss devices 706 similar to the one in FIG. 6 are combined on a substrate 702. In FIG. 7(a) an input 704 is split and coupled to first and second gain/loss devices 706, that can be fabricated on substrate 702, and to two outputs 710. The split can cause loss. First and second gain/loss devices 706 are biased for gain or loss to produce amplification or attenuation. The basis of optical switch 700 uses the simultaneous gain in one waveguide 706 and loss in the other to channel light through the former and not the latter. Splitting loss can be overcome in one or both waveguides 706.

Figure 7B:
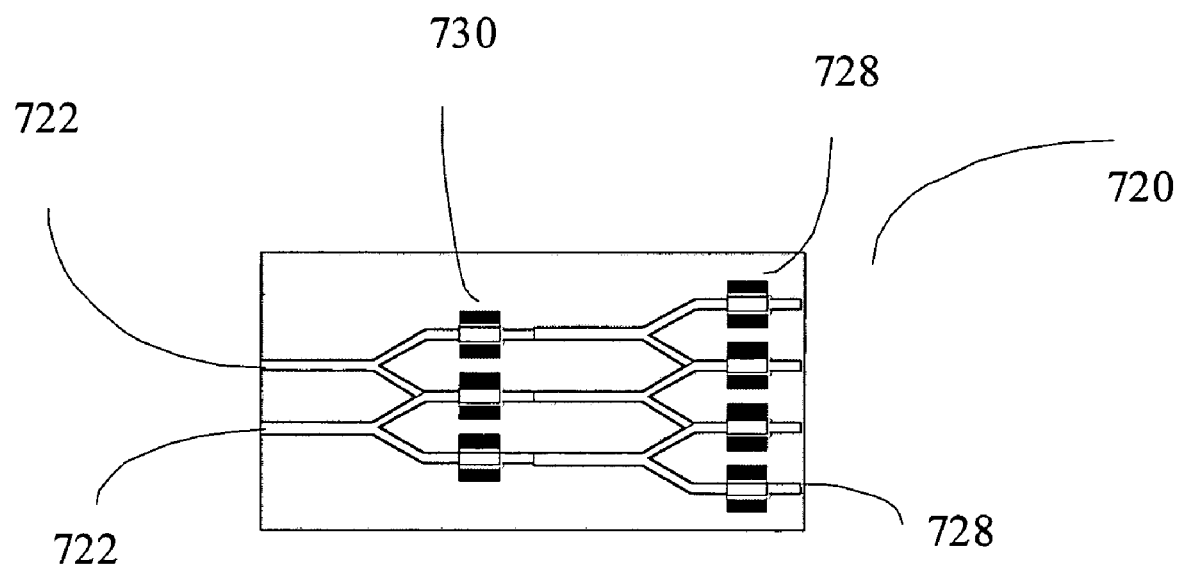
FIG. 7(b) is a perspective view of an all optical multiplexer of the present invention.

In FIG. 7(b), an all optical multiplexer 720 includes two inputs 722 that are optically routed to any of four outputs 728. The FIG. 7(b) architecture can be scaled to include any number of inputs 722, outputs 728 and gain/loss devices 730 to form the fundamental fabric of an optical network router and replaces optical-electrical-optical switching with an all optical architecture.

Figure 8:
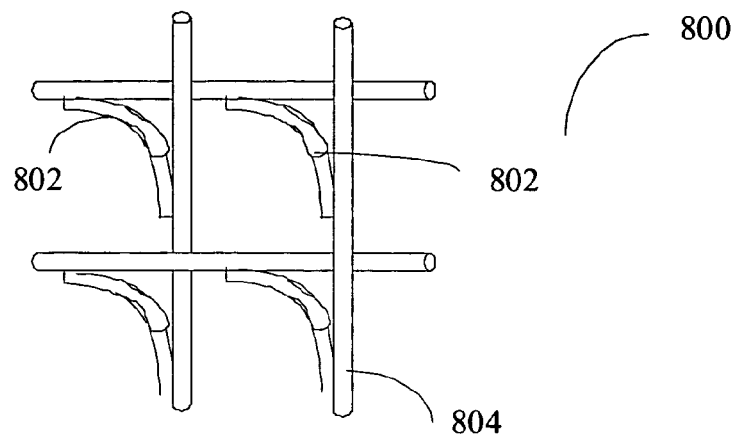
FIG. 8 is a schematic diagram of an N×N optical cross-connect embodiment of the present invention.

The FIG. 7(b) architecture can be scaled to an N×N optical cross-connect (OXC) 802 that are curved rather than linear. In FIG. 8 light is coupled into and out of substrate (not shown) with a number of "N" conventional linear waveguides 804 that crisscross substrate (not shown) to form an N×N grid pattern. Linear waveguides 804 traverse in orthogonal directions where each direction is on a different level in the growth direction of substrate (not shown). Each curved optical gain/loss device 802 joins the orthogonal linear waveguides 804. Light is coupled into and out of the linear waveguides 804 and there is suppressed mode interference over the region where curved gain/loss waveguides 804 join with linear waveguides 804. Optical gain/loss devices 802 overcome the losses associated with the suppressed mode coupling, and light is switched between two orthogonal inputs when optical gain is initiated in curved optical loss/gain devices 802.

Figure 9:
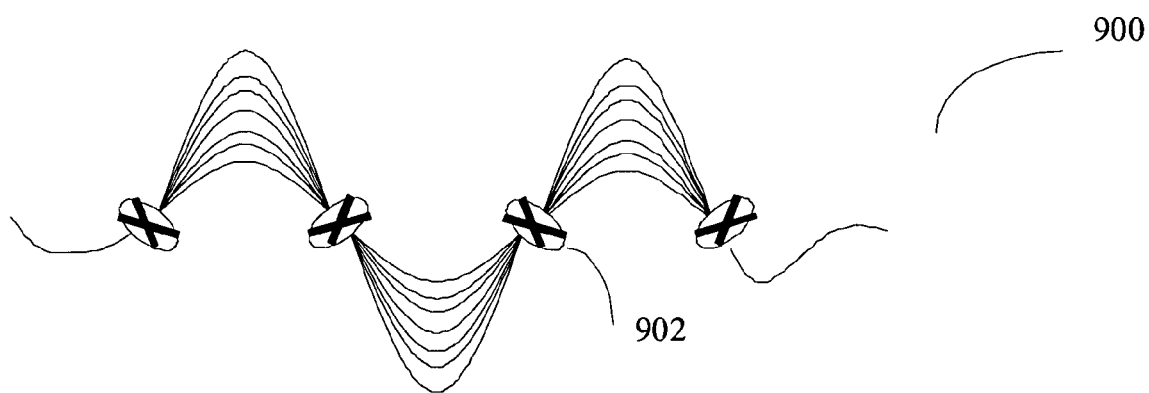
FIG. 9 is a schematic diagram of a wavelength router/selector embodiment of the present invention.

Referring now to FIG. 9, another embodiment of the present invention is a wavelength router/selector 900. In this embodiment, optical switches 700 of FIG. 7(a) form optical gates 902 that are combined with passive wavelength routers of the type disclosed in U.S. Pat. No. 5,351,146, incorporated herein by reference. The passive wavelength router 900 splits the various DWDM channels into separate waveguide gratings and then directs them into appropriate output fibers.

Selection of an output port is determined by the choice of wavelength used. Because multiple wavelengths may be used on each output fiber, multiple simultaneous wavelength paths exist from each input fiber. The wavelength routing properties of wavelength router/selector 900 are periodic two ways. First, the spacing between frequencies for each output selection are equal. Second, multiple free spectral ranges exist in the wavelength router/selector 900 so that the optical muting property also repeats. This is achieved without power splitting loss because for a given wavelength constructive interference occurs only at the waveguide (not shown) or optical path designed for that wavelength, an all other waveguides (not shown) cause destructive interference which prevents energy coupling to them.

The use of optical switches 902 enables wavelength router/selector 900 to be a dynamically re-configurable, all-optical wavelength router. This eliminates the need for optical frequency changers at the interface between the Level-1 and Level-2 networks or within the Level-2 networks. In current networks, this function is performed by multiple optical-electrical-optical conversions which are expensive and bulky.

Figure 10:
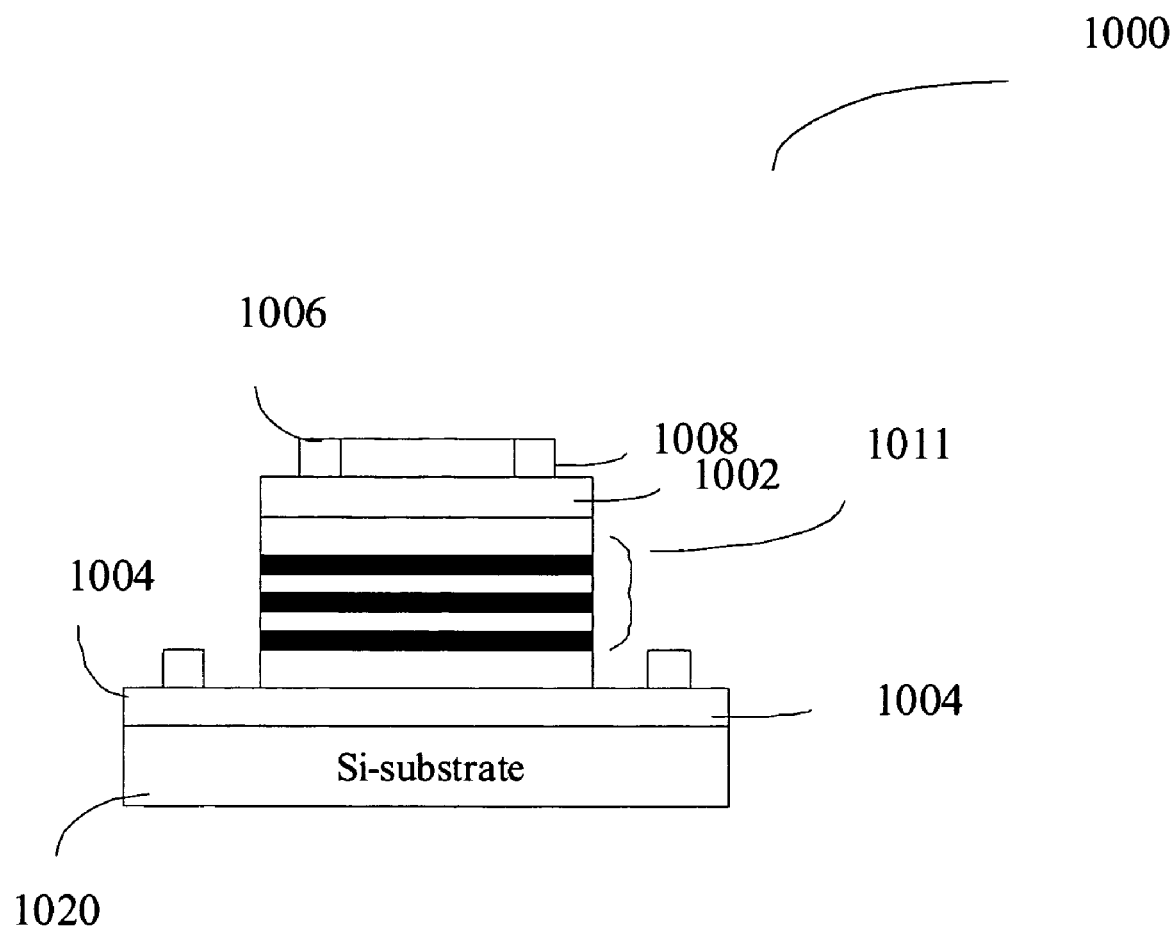
FIG. 10 is a cross-sectional diagram of an optical receiver embodiment of the present invention.

Referring now to FIG. 10, the present invention is also an optical receiver 1000 where photons are converted into electrons. Optical receiver includes superlattice 1011 positioned between a p-doped layer 1002 and an n-doped layer 1004 which can both be made substantially of silicon. Electrodes 1006 and 1008 are coupled to p-doped layer 1002 and n-doped layer 1004. Electrodes 1006 and 1008, in combination with other circuit elements, provide biasing, small-signal amplification and noise filtering. Superlattice 1011 can be integrally formed with substrate 1020 or pseudo substrate (not shown). Additional elements can be integrated with substrate 1020 or pseudo substrate not shown. This level of integration enables optimum speed and minimal noise, giving the best signal to noise ratio and excellent detection characteristics.

Figure 11:
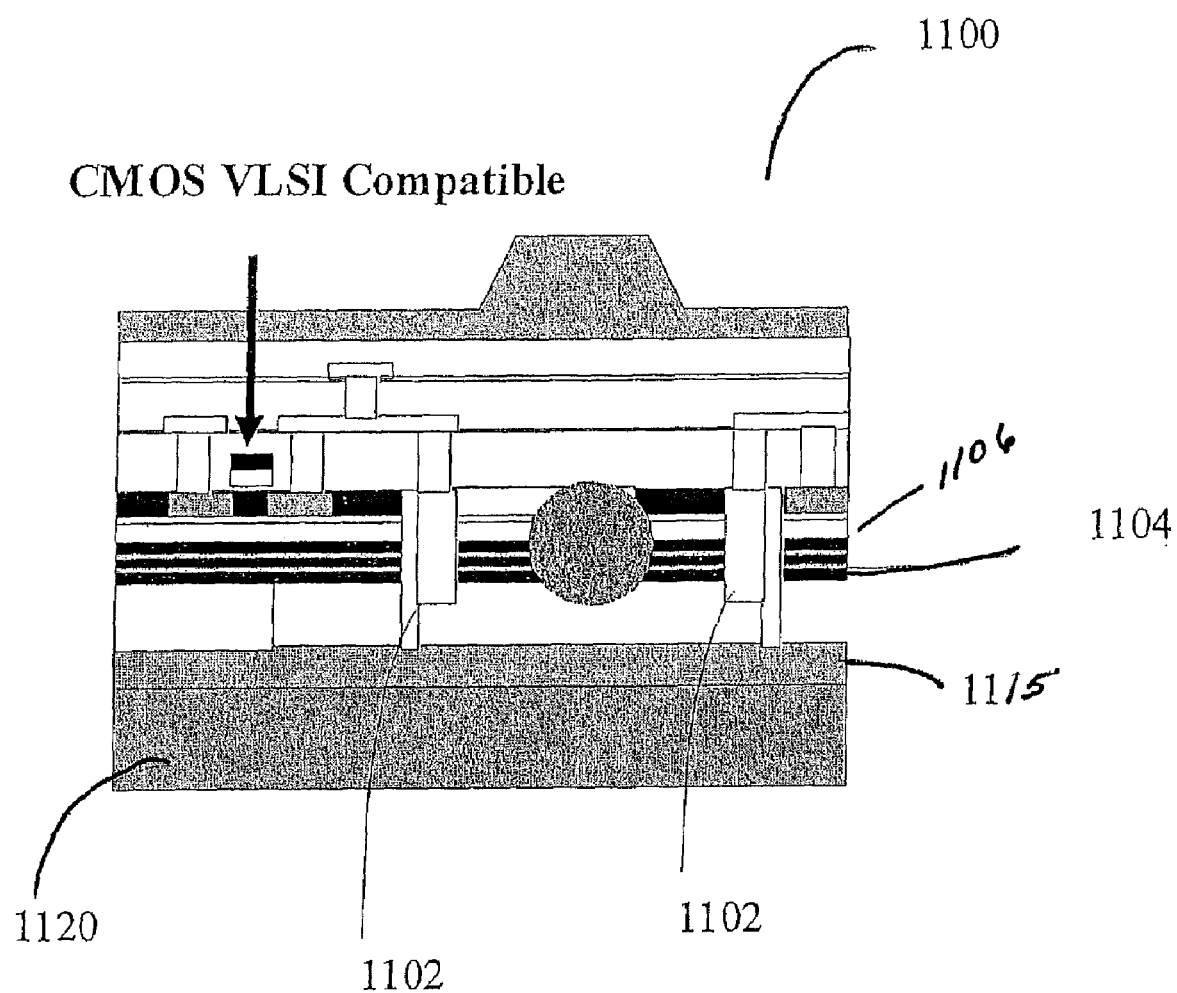
FIG. 11 is a cross-sectional diagram of an edge-emitting laser embodiment of the present invention.
Figure 12:
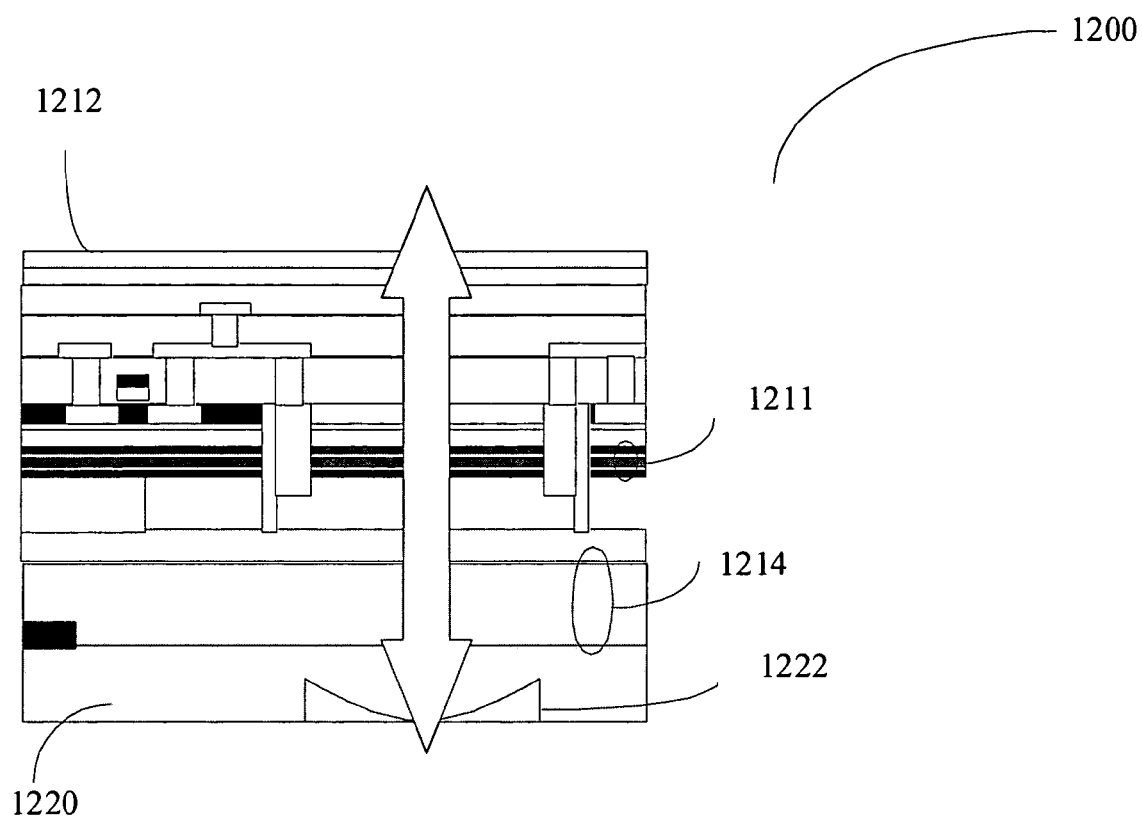
FIG. 12 is a cross-sectional diagram of a VCSEL embodiment of the present invention.

The present invention is also a tunable or non-laser such as an edge emitting laser 1100 of FIG. 11 or a VCSEL 1200 of FIG. 12.

Edge emitting laser 1100 includes superlattice 1104 in the plane of substrate 1120 or pseudo-substrate 1115. Edge-emitting laser 1100 includes electrodes 1102 to excite superlattice 1104, lower and upper optical waveguide cladding layers, a high mobility silicon layer used for electronic transistor construction, n-type well field effect transistors (FET), a field effect, gate oxide layer, a silicon oxide isolation layer, and lateral oxidation of silicon layers that are used for electronic and superlattice 1104 isolation.

FIG. 11 illustrates one embodiment of the integration of a rare-earth crystal field superlattice 1104 grown epitaxially on substrate 1120 and pseudo-substrate. Following the completion of superlattice 1104 a spacer layer 1106 is grown to isolate a high mobility silicon layer that is suitable for Si CMOS VLSI. This example of an MBE grown epitaxial compound silicon-based substrate 1120 or pseudo-substrate 1115 can then be processed to form ion-implantation doped regions, electrical contacts to the doped ion-implanted regions, silicon oxide field effect gate regions and dielectric isolation regions With VCSEL 1200 of FIG. 12, light travels in superlattice 1211 orthogonal to the plane of substrate 1220 or pseudo substrate (not shown). First and second mirrors 1212 and 1214 define a resonant cavity. VCSEL 1200 includes electrodes to excite superlattice 1211, lower and upper optical waveguide cladding layers, a high mobility silicon layer used for electronic transistor construction, n-type well field effect transistors (FET), a field effect, gate oxide layer, a silicon oxide isolation layer, lateral oxidation of silicon layers that are used for electronic and superlattice 1211 isolation, and a micromachines silicon micro-lens array 1222 in substrate 1220.

Reflectors 1212 and 1214 can be grown as Bragg gratings, or produced by cleaving facets on the ends of substrate 1220 or pseudo-substrate. This cleaving process is described in U.S. No. 5,719,077, incorporated herein by reference. The output wavelength of the lasers 1100 and 1200 can be tuned by varying the repeating unit as described in FIG. 1a of superlattice 1211, which changes the crystal field and hence the transition energy of the laser transition. Bragg elements Acting either as an integral cavity mirror or external feedback element, can be fabricated at the output end of lasers 1100 and 1200 to provide feedback which limits and controls line width. Tuning and bandwidth can be controlled by varying period of repeating unit 14 like the one shown in FIG. 1a.

The optical gain material is located beneath the final high mobility silicon layer. Optical gain regions can be electrically isolated using ion-implantation or deep trenches. The optical mode of planar waveguide photonic circuits can be designed as ridge-type, buried core, stripe or implant diffused geometries. Relative temperature stability of the emission wavelengths of the gain spectrum allow high frequency and power silicon electronics to be operated simultaneously.

The optical waveguide mode can be confined in the core region by appropriate growth of suitable lower cladding material. This can be achieved for the core and cladding layers by selectively altering the layer refractive index via impurity doping; or via the use of silicon germanium alloys or the use of silicon oxide buried layers. The latter example, can be implemented for the lower cladding oxide layers using epi-ready separation by oxygen implantation (SI-MOX) silicon wafers, silicon-on-insulator (SOI) or silicon-on-sapphire (SOS) starting substrates 1120 or pseudo-substrates.

With VCSEL 1200, very few layers 12 as shown in FIG. 1a are required to form mirrors 1212 and 1214 because the index contrast between layers 12 can be made very large. With the use of a silicon-based material, the refractive index difference between silicon-based DBR mirror 1212 and buffer is much higher and the required number of layers 12 for mirrors 1212 and 1214 can be as low as two to ten.

VCSEL 1200 uses superlattice 1211 as the gain medium. The cavity is formed by a high reflectivity quarter wave pair Bragg mirror 1212 and output coupling quarter wave Bragg reflector 1214. The multi period high reflectivity mirror 1214 can be grown/fabricated preceding superlattice 1211 or as part of the final processing steps of the CMOS compatible process. The backside of substrate 1220 can be micromachined into arrays of micro-lenses or optical fiber receptacles. This process would allow simple alignment of optical-interconnects from chip-to-chip or fiber-to-chip.

Additionally, a wavelength tuning member, sensor and control loop can each be coupled to lasers 1100 and 1200. In response to a detected change in temperature or optical power the control loop sends an adjustment signal to the tuning member and the tuning member adjusts a voltage or current supplied to laser 1100 and 1200 to provide a controlled output beam of selected wavelength.

Figure 13:
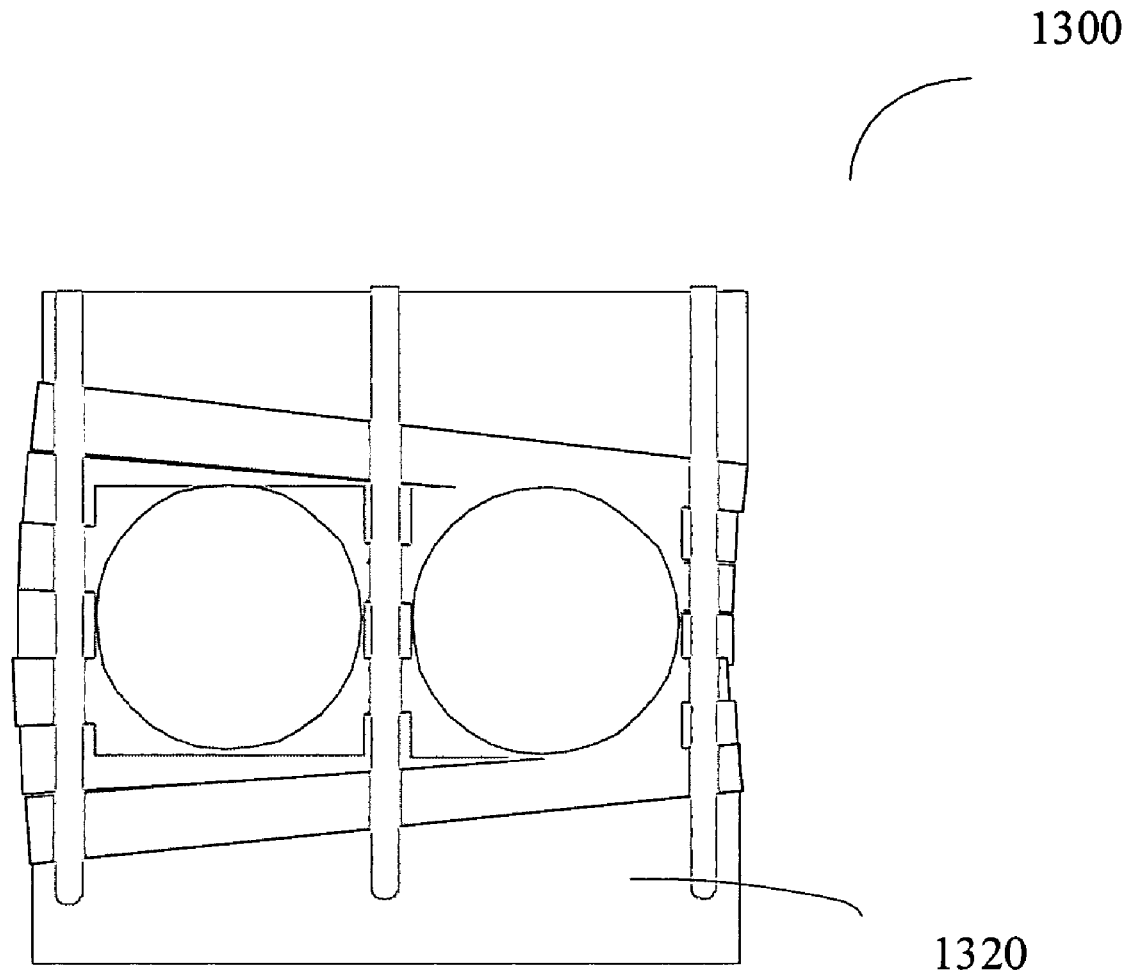
FIG. 13 is a cross-sectional diagram of one embodiment of a chirped superlattice of the present invention.

The period of repeating unit 14 as shown in FIG. 1a can be chirped across substrate 1320 or pseudo substrate as shown in FIG. 13. This provides a controlled variation of wavelength based on the position on substrate 1320 or pseudo substrate (not shown). The crystal field varies with physical period and composition of the superlattice, thus varying the period in a continuous fashion (i.e., chirp) causes a continuous shift in crystal field and therefore laser output wavelength. Multiple lasers with different wavelengths, separated by discrete steps, can be produced on a single substrate 1320 or pseudo substrate. This provides discrete step tuning from a single component with internal circuitry simply by electronic selection of the appropriate wavelength laser. This can be created on the same substrate 20 (shown in FIG. 1a) or pseudo substrate (not shown) using standard VLSI techniques. In this manner, lasers 1100 and 1200, and their electronic switching fabric, reside on the single substrate 1320 or pseudo substrate. The appropriate laser wavelength is then selected by electrical input signals which on-board chip components decode, or by simple external wiring which can be grown as selective area growth MOCVD. With this concept, superlattice 11 as shown in FIG. 1a can be initially grown as a structure that changes its layer 12 thickness uniformly across a cross-sectional area. This is useful for a transmitter in a DWDM system.

Figure 14:
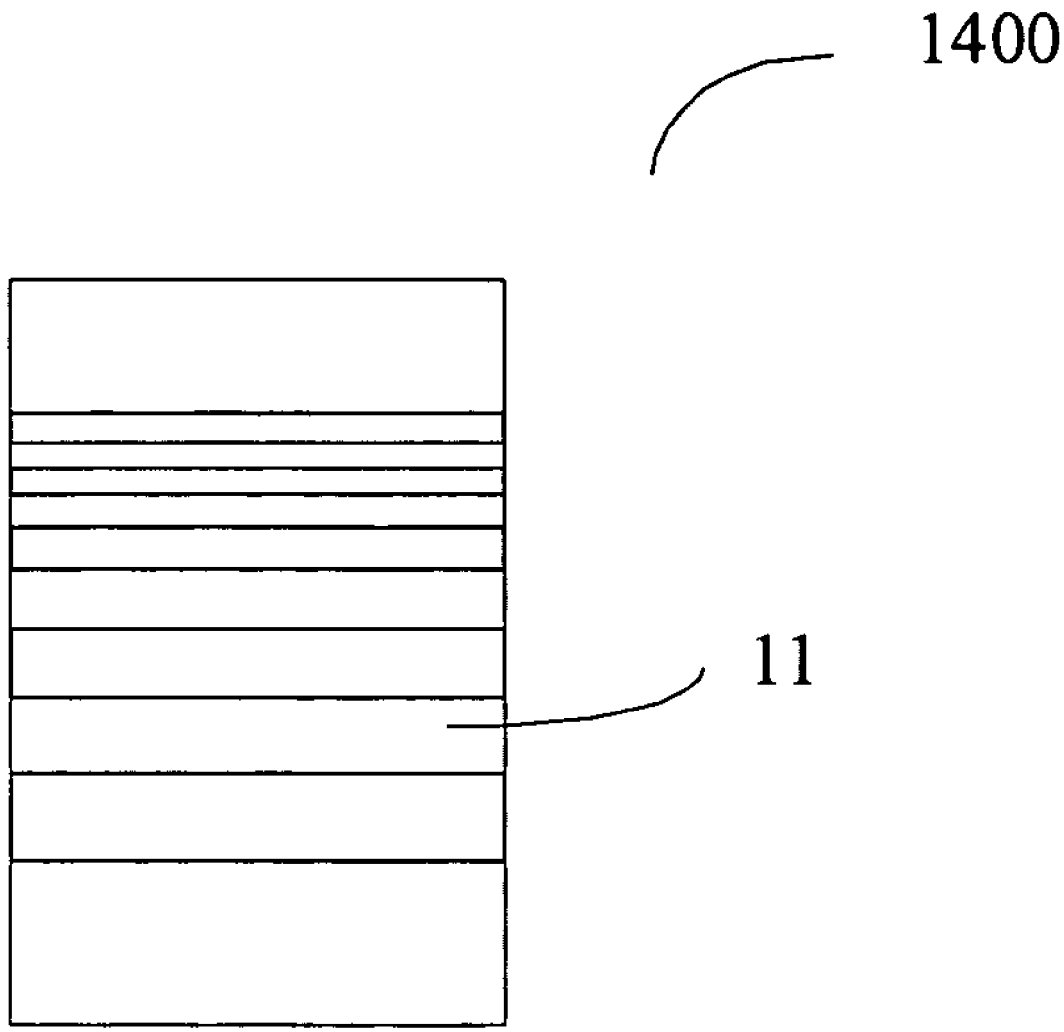
FIG. 14 is a cross-sectional diagram of one embodiment of a superlattice of the present invention chirped by varying the thickness of the alternating rare-earth layers.

As illustrated in FIG. 14, superlattice 11 can also be chirped by varying the thickness of the alternating rare-earth layers. In this embodiment, both the bandwidth and center wavelength are controlled.

Figure 15:
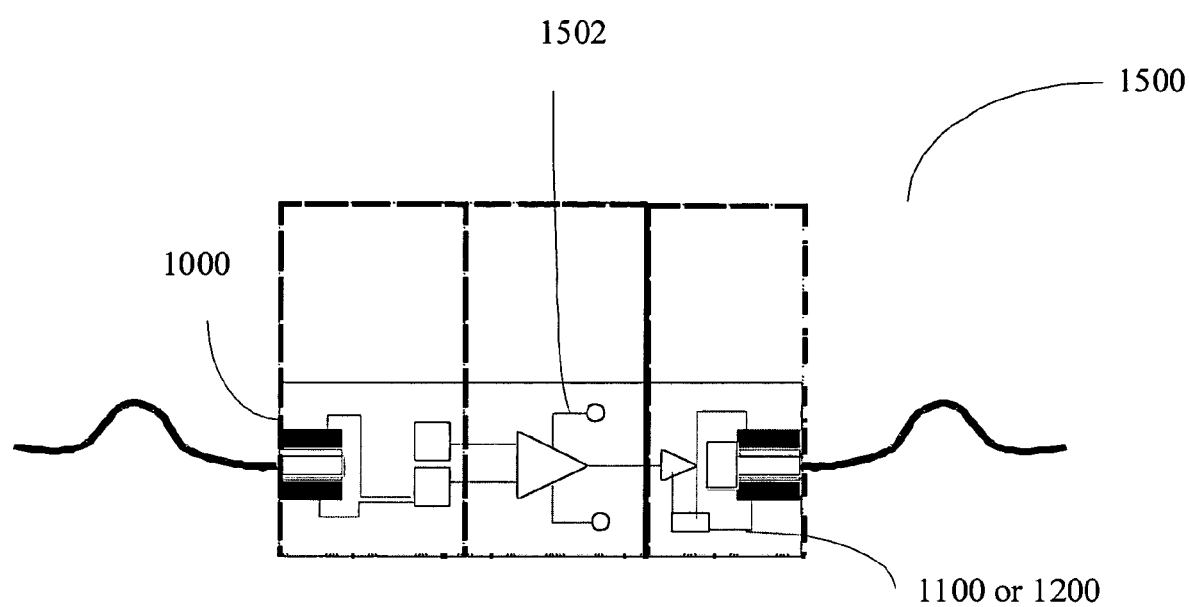
FIG. 15 is a perspective view of a transceiver embodiment of the present invention.

Referring now to FIG. 15, optical receiver 1000 of FIG. 10 can be combined with laser 1100 or 1200 on the same substrate 1520 or pseudo substrate to form a monolithic transceiver 1500. Circuitry 1502 is also fabricated on the same substrate 1520 or pseudo substrate. Circuitry 1502 can include an electrical amplifier, signal processor, diode laser driver and the like. Circuitry 1502 can be used to, bias optical receiver 1000 and lasers 1100, 1200, amplify the photons detected by optical receiver 1000, drive and modulate laser 1100 and 1200, and the like. Circuitry 1502 enables conversion of photons into electrons and enables electrons to drive and modulate laser 1100 and 1200. Monolithic transceiver 1500 can be used to replace the discrete elements in a standard telecommunications router.

Figure 16:
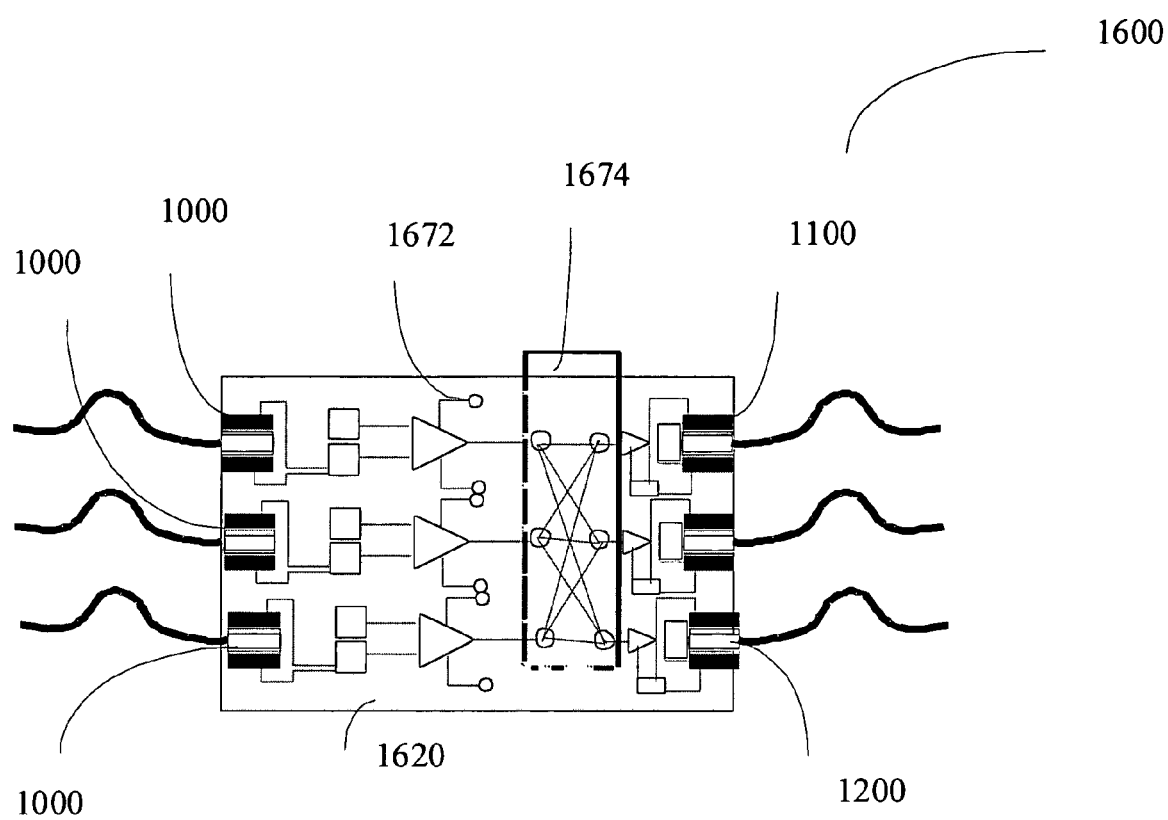
FIG. 16 is a perspective view of an optical router of the present invention.

In another embodiment, illustrated in FIG. 16, a monolithic optical router 1600 includes a plurality of lasers 1100 and 1200 and a plurality of optical receivers 1000 all combined on a single substrate 1620 or pseudo substrate with circuitry 1672. Circuitry 1672 biases the plurality of lasers 1100 and 1200 and optical receivers 1000 to amplify the photons that are detected and then drive and modulate the plurality of lasers 1100 and 1200. An additional set of circuit elements forms an electrical switching fabric 1674 that enables signals generated by one or more of the optical receivers 1000 to be routed to any laser 1100 and 1200. Monolithic optical router 1600 enables optical signals on any one of an input to be switched to any one of the outputs.

Another embodiment of the present invention, illustrated in FIG. 17, is a wavelength converter 1700 with at least two optical loss/gain devices 24. Data is carried via modulated on an optical signal at a first wavelength, and input 1720 to the waveguide. A second wavelength is input 1722 to the waveguide and mixes with the first wavelength. The modulation from the first wavelength is transferred to the second wavelength by cross-gain or cross-phase modulation. The traveling wave (single pass) gain receives simultaneously the modulated optical signal at the first wavelength and the second optical signal at the desired wavelength. The first optical signal affects the gain of the traveling wave gain as seen by the second optical signal so as to impress a representation of variations in the envelope of the first optical signal onto the second optical signal. The basic structure is that of a Mach-Zehnder interferometer with cross-phase modulation.

FIG. 18 illustrates a parametric nonlinear optical element 1800 embodiment of the present invention. Superlattice 11 forms a first waveguide 1880, which can be optical loss/gain device 24, that is optimized for optical gain at a predetermined pump wavelength, e.g. 1540 nm. Additional superlattice structures 11 form second and third waveguides 1882 and 1884 on opposite sides of first waveguide 1880. Second and third waveguides 1882 and 1884 are optimized for side-band frequencies adjacent to the pump wavelength, including but not limited to 1650 nm and 1450 nm. Second and third waveguides 1882 and 1884 are positioned sufficiently close (i.e., close to the wavelength of the light; e.g. 1.5–3 um for 1500 nm light) as to achieve evanescent wave-coupling to first waveguide 1880 in order to allow coupling. When the pump wavelength propagates through first waveguide 1880 sideband wavelengths are driven in second and third waveguides 1882 and 1884, and energy flows from the pump wavelength to the sideband wavelengths. This creates a passive wavelength converter through nonlinear optical coupling. Subsequent to the conversion, additional optical loss/gain devices 24 can be placed in order to suppress the residual pump and enhance either or both of the sideband wavelengths. In this embodiment, parametric nonlinear optical element 1800 becomes an active element which switches between adjacent DWDM channels to allow wavelength routing.

The present invention is also a quasi-phase matched nonlinear element 1900, as shown in FIG. 19. In this embodiment, superlattice 11 is grown with a periodic variation in refractive index in order to induce gain at signal or idler frequencies of the input beam to quasi-phase matched nonlinear element 1900. The periodic variation is chosen to achieve quasi-phase-matching through periodic refractive index variation at the appropriate frequency. In this embodiment, the active region layers act as a nonlinear optical crystal whose gain can be electrically enhanced. The signal and idler frequencies are those of an optical parametric oscillator (OPO) in the 1000–2000 nm telecommunications band. Acting as an OPO, the active region layers can shift an input DWDM wavelength to another wavelength with the energy difference carried off by the idler wavelength.

Figure 20:
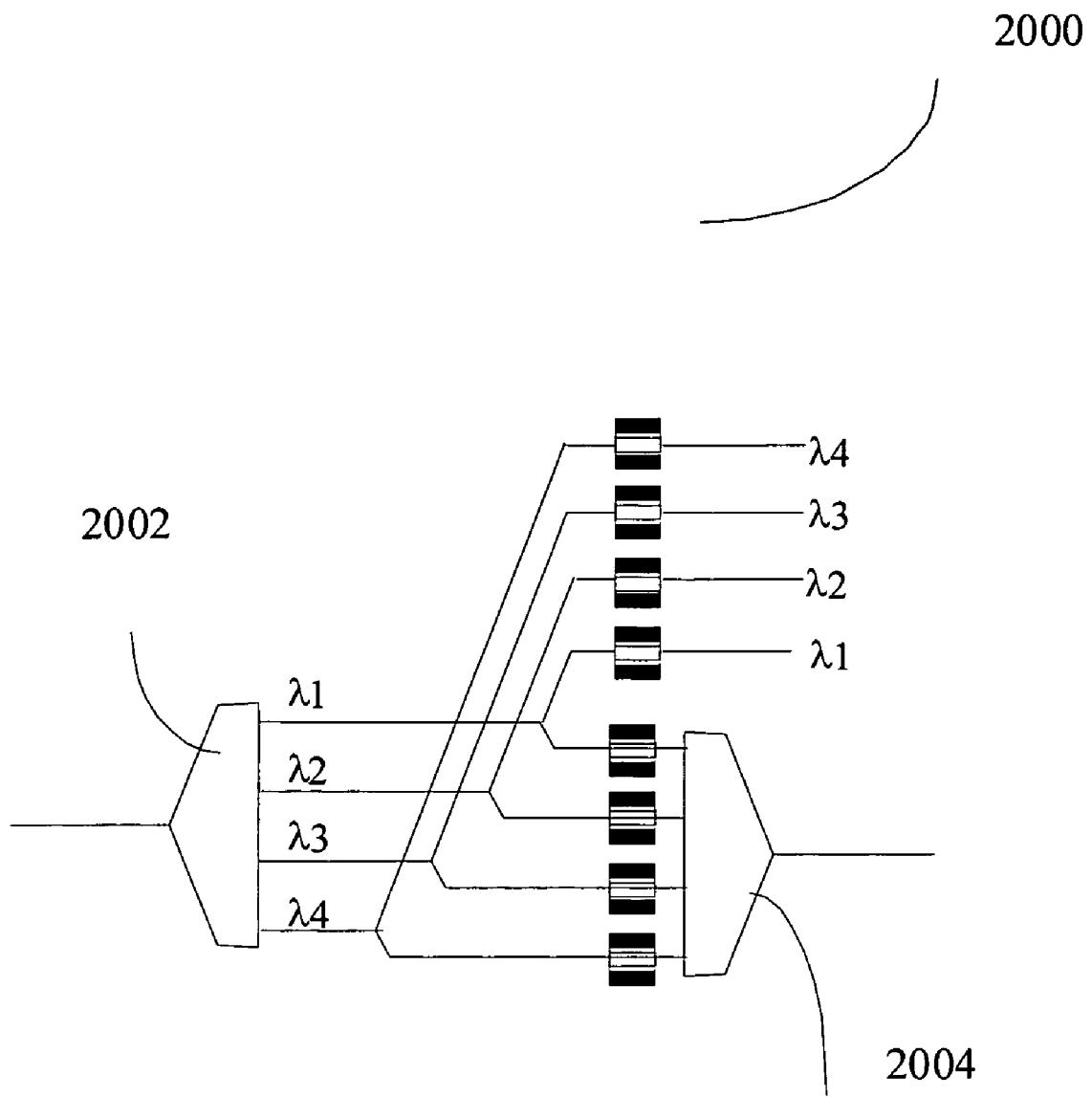
FIG. 20 is a perspective view of an all optical add-drop multiplexer embodiment of the present invention.

In another embodiment, illustrated in FIG. 20, multiple optical loss/gain devices 24 are used in an all optical add-drop multiplexer (OADM) 2000. OADM 2000 includes an optical demultiplexer 2002 that splits an input WDM signal into individual optical signals, leading to respective 2×2 switches. Each switch has another input that originates from a plurality of add lines and selects one of its inputs to be dropped and the other to continue along a main signal path.

The retained signals may be modulated and attenuated prior to being tapped and finally multiplexed together by a WDM multiplexer 2004. The tapped signals are opto-electronically converted and fed back to a controller, which can include controller software, that controls the switching, modulation and attenuation. This permits remote control of OADM 2000 functions by encoding instructions for the controller into a low-frequency dither signal that is embedded within the individual optical signals. OADM 2000 can, in real time, be instructed to reroute traffic, dynamically equalize or otherwise change optical channel power levels, and add or remove dither signal. A specific optical channel may be reserved for control purposes, allowing a network administrator to "log in" to OADM 2000 and override the controller software algorithm. Optionally, the optical signals can be tapped upon entry to OADM 2000. A bi-directional OADM can be constructed from two unidirectional OADM's 2000 that can share the same controller. Additionally, a single, general multi-input multi-output switch can be used to provide an arbitrary mapping between individual input and output optical signals.

Figure 21:
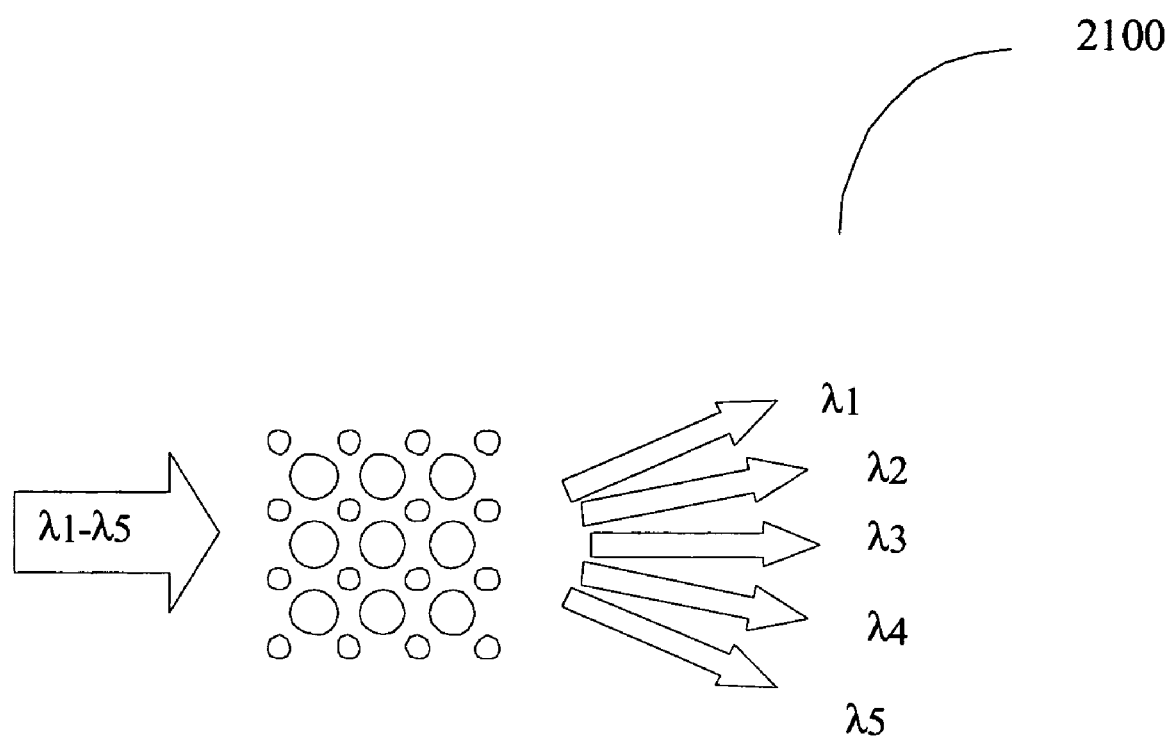
FIG. 21 is a schematic diagram of a two-dimensional photonic bandgap (2D-PBG) structure embodiment of the present invention.

Alternatively, as shown in FIG. 21, the present invention is also a two-dimensional photonic bandgap (2D-PBG) structure 2100 implanted in the output path of the input beam or waveguide. Bandgap structure 2100 includes superlattice 11 with periodic variation, and repeating units 14 of bandgap structure 2100 are selected to optimize the diffraction of light. Bandgap structure 2100 consists of an array of predominately cylindrical ion-implantation disordering doped or physically etched regions either within or external to the superlattice, orthogonal to the plane of substrate 20 or pseudo substrate 22 which acts as a diffraction grating.

Scatter radiation emitted from bandgap structure 2100 fans out at angles with the angle of diffraction being determined by the wavelength of the radiation. Thus the photonic bandgap structure acts as a diffraction grating but with substantially higher efficiency and customized dispersion. Unlike a diffraction grating, bandgap structure 2100 directs spatially resolved wavelengths in the forward direction. This is advantageous for highly dispersive, integrated wavelength selective opto-electronic structures. Bandgap structure 2100 can be an active DWDM filter that separates various wavelengths. The separated wavelengths can then be coupled into their own waveguides. Each waveguide can then be coupled to a switch 700.

Figure 22:
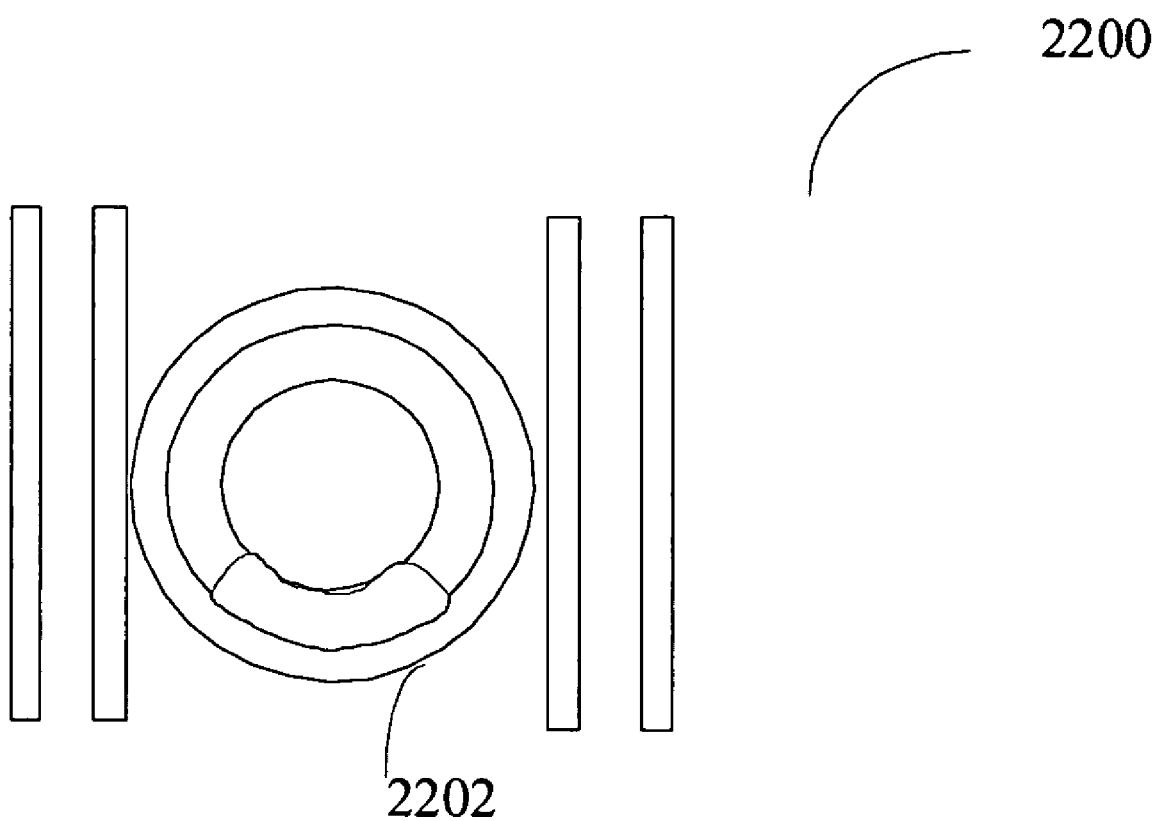
FIG. 22 is a schematic diagram of a selectable wavelength add/drop multiplexer embodiment of the present invention with a concentric ring waveguide ring.

In another embodiment, illustrated in FIG. 22, the present invention is a selectable wavelength add/drop multiplexer 2200 that has a concentric ring waveguide 2202 fabricated in substrate or pseudo-substrate to form a "Light Coral" of the type described by Nanovation, "The Micro revolution", Technology Review" July–August 2000, incorporated herein by reference, in which light of a frequency resonant with ring waveguide 2202 is selectively coupled out of one vertical waveguide and into the other vertical waveguide, via ring waveguide 2202 which includes a superlattice 11 with optical gain/loss device 24 to enhances or suppress the wavelength coupled into ring waveguide 2202. The addition of optical gain/loss device 24 makes ring waveguide 2202 act as selectable wavelength add/drop multiplexer 2200.

The present invention can also be an actively equalized array waveguide grating shown in FIG. 9. By combining the properties of optical gain and detection in devices that include superlattice 11 provides integrated optical monitoring devices and systems. Input wavelength division multiplexed signals are separated into the constituent individual wavelengths by the arrayed waveguide grating (AWG) and propagate through individual waveguides. Superlattice 11 can attenuate or amplify each of these signals independently, thereby providing dynamic spectral gain control and equalization. For example, an AWG can include superlattice 11. Waveguides 24 of the AWG can have multiple electrodes that are configured to either provide control of the gain or a photodetection of the propagating optical signal. Active feedback of the gain sections can be controlled by monitoring the optical power in each of the waveguides and thus provide the capability of actively equalizing the AWG.

Figure 23:
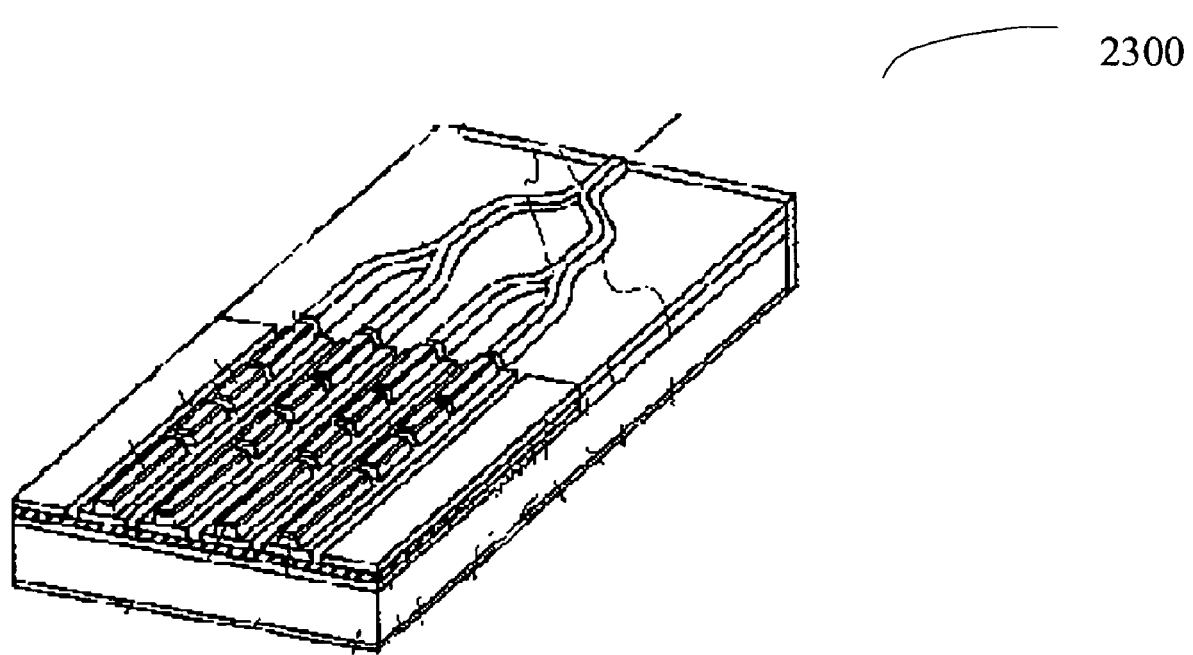
FIG. 23 is a perspective view of an optical integrated circuit embodiment of the present invention.

A further embodiment of the present invention is an optical integrated circuit 2300, illustrated in FIG. 23 that includes many of the FIG. 1–FIG. 22 devices and embodiments. Such a circuit combines photons and electrons into a single substrate, fabricated by a single process, and enables both optical and electrical gain and control to be integrated together. Full VLSI functionality includes all electrical functions currently employed in silicon VLSI such as memory, switching, gain, computation, fuzzy logic, error checking, and restoration. Likewise, all optical functions currently achieved by discrete passive and active components, such as optical switching, wavelength filtering, optical mixing, amplification, loss, MUX/DEMUX, detection, modulation, laser output, LED, and nonlinear effects, can also be integrated through silicon VLSI.

Another embodiment of the present invention is a quantum cascade lasers that includes a superlattice structure comprising primarily of crystalline Si and MOx layers. When the oxide layers are made sufficiently thin, the one dimensionally confined electron and hole wavefunctions may penetrate appreciably into the high energy potential barrier oxide layers. By further decreasing the thickness of the oxide layer, adjacent quantum well wavefunctions will overlap and a miniband will form. Each of these miniband has several non-degenerate delocalized energy levels. The added advantage of such superlattice is that it has a very large valence and/or conduction band offsets. The geometry of the superlattice can be tailored such that the spatial wavefunction probability density can be optimized for specific regions.

[The Following is from §4 L22 to §6 L22 of the Specification of U.S. Pat. No. 6,734,453 Unchanged Except for Figure # References.]

Referring now to FIGS. 1(*a* and *b*) and FIGS. 24 A, B and C, in one embodiment of the present invention a photonic device 10 is a silicon based superlattice 11. Superlattice 11 includes a plurality of individual layers 12 that form a plurality of repeating units 14. At least one of layer 12 is an active region layer 16 with at least one rare earth ion. FIG. 1(*b*) illustrates one embodiment of superlattice 11 with an erbium trivalent ion inside active region layer 16 that generates a crystal field.

Preferably repeating units 14 are periodic. At least a portion of active region layer 16 can be a narrow or a wide band gap semiconductor. This can be achieved when the rare-earth ion is grown as part of a narrow band gap silicon-based material or when the rare-earth ion is introduced into the material effectively to make the material a narrow band gap material. Photonic device 10 can be an LED, amplifier, laser, photodetector, AWG, modulator, phototransistor, quantum logic gate, photonic bandgap structure, FET, MOSFET, HFET, HBT, waveguide, and the like.

In one embodiment, superlattice 11 includes at least one amorphous layers 12. In another embodiment, at least one of the layers in at least one repeating unit 14 has an amorphous layer 12. At least one crystal growth modifier can be included in an individual layer 12 of each repeating unit 14. Suitable growth modifiers include but are not limited to C, As, P, B, H, O, N, Sn, Pb and the like. Additionally, during the deposition of each layer 12, additional iso-electronic centers can be added, including but not limited to oxygen, nitrogen and the like, to enhance or activate the rare-earth and control the deposition growth or surface structure of the atoms (i.e., the reconstruction).

Photonic device 10 can be a component in a telecommunication system. In various embodiments, photonic device 10 can produce optical gain to drive a laser emission at a preferred wavelength, for example 1500 to 1650 nm, amplify an incident optical signal, overcome optical losses of other system elements, or detect a optical signal at a preferred wavelength. Photonic device includes a superlattice that can be made of a variety of different layers and combinations thereof, 12 including but not limited to, silicon, silicon germanium, silicon oxide, oxygen-doped silicon, RE-doped silicon, rare earth silicates ($RE_xSi_{1-x}$), rare earth silicon germanium ($RE_x(SiGe)_{1-x}$) and the like.

In one embodiment, superlattice 11 consists of dissimilar materials of type A, B and C in repeating units 14, for example, of the type (ABA . . . ABA), or (ABCABC . . . ABC). The number and composition of repeating units 14 is determined by the rare-earth ion interaction cross-section or density required; i.e., to increase interaction cross-section, either the number of layers is increased, or the rare earth density in each active layer is increased, or a combination of both. The density of the rare-earth ion is determined by the stoichiometry of the layer 12 which includes the rare-earth ion. Another embodiment is an ABCABC layer sequence with dissimilar materials A, B, and C.

Oxygen is an electronegative atom and very efficient in bonding the rare-earth into a trivalent state. Therefore, oxygen doped silicon or silicon-based suicides are useful as component layers of superlattice 11. In one embodiment of the ABA repeating unit 14 layer sequence, the A layer is an oxygen deficient erbium silicide, represented as $Er_x Si_{1-x}$ material, or an erbium containing silicon-germanium material, represented as $Er_x (Si_y Ge_{1-y})_{1-x}$. The B layer is an oxygen containing non-stoichiometric or stoichiometric silicon-based material such as $SiO_x$, $SiGeO_x$, or oxygen-doped silicon.

In one specific embodiment, layer A is an erbium containing silicon-based layer that is oxygen deficient; layer B is a silicon-rich erbium and oxygen deficient material layer; and Layer C is an oxygen containing silicon-based layer deficient of rare-earth ions. In this particular structure the erbium and oxygen silicon-based layers, respectively, are separated spatially by a predominately silicon transition layer which is deficient in both erbium and oxygen. Permutations of the preceding can be grown in order to gain the highest compromise between epitaxial structural ordering for low defect density and optical activation of the rare-earth ion.

Photonic device 10 can have at least one spacer layer 18 between two adjacent repeating units 14. Additionally, a spacer layer 18 can be positioned between more than one pair of adjacent repeating units 14, including all adjacent repeating units 14. The spacer layer is used to improve the structural quality, symmetry, optical quality, or electronic quality of the superlattice.

Additionally, superlattice 11 can be positioned or grown on a substrate 20, including but not limited to a silicon substrate, or on a pseudo-substrate buffer layer that has a lattice constant which is different from a lattice constant of a bulk silicon substrate. Where a psuedo substrate is defined as thick layer with low defect surface density that is grown over the substrate.

In one specific embodiment, superlattice 11 is grown on silicon substrate 20 along (001)- and (111), (211), (311), (411) and the like growth directions of the silicon substrate 20. The growth of the lattice matched and/or lattice mismatched layers 12 can be epitaxially grown on silicon substrate 20 or on a pseudo substrate 22 that can be a bulk or superlattice strained, or relaxed buffer layer. FIG. 2(b) illustrates superlattice 11 growth in the (111) direction. FIG. 2(c) illustrates an in-plane erbium/silicon active layer crystal structure without defects grown on a (111)-orientated surface.

In various embodiments, active region layer 16 has a lattice layer that is less than, the same as or equal to a lattice constant of silicon substrate 20 or pseudo-substrate buffer layer 22. It may be preferred for active region layer 16 containing the rare-earth atoms to be in a mechanically stressed state when grown epitaxially on silicon substrate 20 or pseudo substrate by either tension, lattice mismatching or compression. This reduces the defect density which in turn improves structural quality.

In certain embodiments, at least one layer in a repeating unit 14 has a lattice constant that is sufficiently different from, (i) a lattice constant of substrate 20 to have an opposite state of mechanical stress or (ii) a lattice constant of pseudo-substrate buffer layer to have an opposite state of mechanical stress. In one embodiment, at least two layers 12 of repeating units 14 have substantially equal and opposite mechanical strain states and, (i) each repeating unit 14 is substantially lattice matched to substrate 20 or (ii) each repeating unit 14 is substantially lattice matched to pseudo-substrate buffer layer (not shown). Additionally, the crystal field of the superlattice can be modified by a strain field induced by lattice mismatched layers in a repeating unit.

One example of strain balanced growth is an erbium containing silicon-based layer 12 that exhibits a lattice constant smaller than bulk silicon and is a lattice mismatched layer 12. Pseudomorphic growth of the lattice mismatched layer 12 can occur if the critical thickness of an erbium silicide layer 12 is not exceeded. The erbium silicide layer 12 is elastically deformed and under tensile strain.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks.

Other variations and embodiments are possible in light of above teachings, and it is thus intended that the scope of invention not be limited by this Detailed Description, but rather by Claims following.

The invention claimed is:

1. A semiconductor crystalline device, comprising:
   a single crystal substrate comprising first and second surfaces; and
   one or more superlattices comprising one or more repeating units each comprising a plurality of layers, wherein at least one of the layers in the one or more repeating units is a substantially single crystal active layer of a composition $[X]_w [RE]_x [J1]_y [J2]_z$ wherein [RE] is chosen from a group comprising Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb) and Luthium (Lu), [X] is chosen from a group comprising silicon, germanium and SiGe mixtures, [J1] and [J2] are chosen from a group comprising Oxygen (O), Nitrogen (N), and Phosphorus (P), x varies from greater than 0 to $\leq 3$ and $0 \leq w$, y, $z \leq 3$.

2. The device of claim 1, further comprising:
   first and second electrodes, wherein at least a portion of said one or more superlattices is positioned between the first and second electrodes.

3. The device of claim 1, further comprising:
   a least one electrode that extends from an exterior of said one or more superlattices to an interior of said one or more superlattices.

4. The device of claim 1, further comprising:
   at least one electrically doped p- or n-type conductivity layer coupled to said one or more superlattices.

5. The device of claim 1, wherein said one or more repeating units are periodic.

6. The device of claim 1, wherein said one or more repeating units may have about the same layer thicknesses.

7. The device of claim 1, wherein a crystal field of said device is configured to be spatially variable by selecting composition of said plurality of layers within said one or more repeating units.

8. The device of claim 1, wherein a crystal field of said device is configured to be spatially variable by altering thicknesses of said layers in said device along a growth direction.

9. The device of claim 1, wherein a thickness of said repeating units varies as a function of distance along said one or more superlattices growth direction.

10. The device of claim 1, wherein the thickness of each said one or more repeating unit may be approximately the same and a thickness of of at least on of said plurality of layers of said one or more repeating units varies as a function of distance substantially along a superlattice growth direction and perpendicular to a superlattice growth direction.

11. The device of claim 1, wherein a composition of said one or more repeating units varies as a function of distance along a superlattice growth direction.

12. The device of claim 1, wherein at least one of said plurality of layers is substantially amorphous.

13. The device of claim 1, wherein at least one of said plurality of layers of said one or more repeating units is at least a partial monolayer.

14. The device of claim 1, wherein each said one or more repeating units has a rare earth oxynitride layer.

15. The device of claim 1, wherein each said one or more repeating units has a rare earth oxide layer.

16. The device of claim 1, wherein each said one or more repeating units has a Si layer that includes a rare earth.

17. The device of claim 1, wherein each said one or more repeating units has a silicon germanium layer.

18. The device of claim 1, wherein each said one or more repeating units has a silicon oxide layer.

19. The device of claim 1, wherein each said one or more repeating units has an oxygen-doped silicon layer.

20. The device of claim 1, wherein each said one or more repeating units has a rare earth silicide layer.

21. The device of claim 1, wherein each said one or more repeating units has a rare earth silicon germanium layer.

22. The device of claim 1, wherein each said one or more repeating units includes an electrically doped p- or n-type layer.

23. The device of claim 1, further comprising:
at least one crystal growth modifier included in at least one said plurality of layers of said one or more repeating units.

24. The device of claim 23, wherein said growth modifier is selected from a group comprising carbon (C), hydrogen (H), oxygen (O), nitrogen (N), phosphorus (P), arsenic (As), boron (B), antimony (Sb), silicon (Si), germanium (Ge) tin (Sn), gallium (Ga), lead (Pb), strontium (Sr), titanium (Ti), aluminum (Al), zirconium (Zr), hafnium (Hf), tantalum (Ta), scandium (Sc), barium (Ba), indium(In), calcium (Ca), fluorine (F), silver (Ag), chlorine (Cl), calcium carbonate ($CaCO_3$), silicon monoxide (SiO) and water ($H_2O$).

25. The device of claim 1, wherein said rare earth [RE] is selected from a group comprising isotopically pure Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb) and Luthium (Lu).

26. The device of claim 1, wherein said rare earth [RE] is Er.

27. The device of claim 1, wherein said active layer comprises at least two different rare earth [RE] ions.

28. The device of claim 1, wherein said substrate is silicon.

29. The device of claim 1, wherein a first of said one or more superlattices is grown on said first surface of said single crystal substrate wherein the orientation of said first surface of said single crystal substrate is a predetermined crystallographic orientation.

30. The device of claim 1 wherein at least one of said plurality of layers in said one or more superlattices is deposited selectively on predetermined regions.

31. The device of claim 1, wherein said substrate comprises a pseudo-substrate buffer layer with a lattice constant that is different from a lattice constant of said substrate.

32. The device of claim 1, wherein said substrate is a silicon-on-insulator substrate.

33. The device of claim 1, wherein said active layer has a lattice constant that is less than a lattice constant of said substrate.

34. The device of claim 31, wherein said active layer has a lattice constant that is less than a lattice constant of said pseudo-substrate buffer layer.

35. The device of claim 1, wherein said active layer has a lattice constant that is about the same as a lattice constant of said substrate.

36. The device of claim 31, wherein said active layer has a lattice constant that is about the same as a lattice constant of said pseudo-substrate buffer layer wherein said pseudo-substrate buffer layer has a lattice constant that is different from a lattice constant of said substrate.

37. The device of claim 1, wherein said active layer has a lattice constant that is greater than a lattice constant of said substrate.

38. The device of claim 31, wherein said active layer has a lattice constant that is greater than a lattice constant of said pseudo-substrate buffer layer wherein said pseudo-substrate buffer layer has a lattice constant that is different from a lattice constant of said substrate.

39. The device of claim 1, wherein at least one layer in said one or more repeating units has a lattice constant that is sufficiently different from a lattice constant of said substrate so as to be substantially in a state of elastic mechanical strain.

40. The device of claim 31, wherein at least one layer in said repeating unit has a lattice constant that is sufficiently different from a lattice constant of said pseudo-substrate buffer layer to be substantially in a state of elastic mechanical strain.

41. The device of claim 1, wherein at least two of said layers of repeating units have substantially equal and opposite mechanical strain energy and strain states and wherein each said repeating unit is substantially lattice matched to said substrate.

42. The device of claim 2, wherein at least two of said layers of said repeating units have substantially equal and opposite mechanical energy and or strain states and wherein each said repeating unit is substantially lattice matched to said pseudo-substrate buffer layer.

43. The device of claim 7, wherein said crystal field is modified by a strain field induced by lattice mismatched layers in said one or more repeating units.

* * * * *